United States Patent
Guo et al.

(10) Patent No.: US 11,688,448 B2
(45) Date of Patent: *Jun. 27, 2023

(54) DIGIT LINE MANAGEMENT FOR A MEMORY ARRAY

(71) Applicant: Micron Technology, Inc., Boise, ID (US)

(72) Inventors: Xinwei Guo, Folsom, CA (US); Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/470,573

(22) Filed: Sep. 9, 2021

(65) Prior Publication Data

US 2022/0076724 A1 Mar. 10, 2022

Related U.S. Application Data

(63) Continuation of application No. 16/450,033, filed on Jun. 24, 2019, now Pat. No. 11,133,047.

(51) Int. Cl.
*G11C 11/22* (2006.01)

(52) U.S. Cl.
CPC ........ *G11C 11/2255* (2013.01); *G11C 11/221* (2013.01); *G11C 11/2259* (2013.01); *G11C 11/2273* (2013.01)

(58) Field of Classification Search
CPC ............ G11C 11/2255; G11C 11/2273; G11C 11/221; G11C 11/2259
USPC ....................................................... 365/145
See application file for complete search history.

(56) References Cited

U.S. PATENT DOCUMENTS

| | | | |
|---|---|---|---|
| 5,592,410 A | 1/1997 | Verhaeghe et al. | |
| 6,137,711 A | 10/2000 | Tan | |
| 7,193,880 B2 | 3/2007 | Madan et al. | |
| 7,577,016 B2 | 8/2009 | Jeong et al. | |
| 10,229,874 B1 | 3/2019 | Ramaswamy | |
| 11,133,047 B2 * | 9/2021 | Guo ..................... | G11C 11/221 |

(Continued)

FOREIGN PATENT DOCUMENTS

KR 20160148719 A 12/2016

OTHER PUBLICATIONS

ISA/KR, International Search Report and Written Opinion of the International Searching Authority, Int'l Appl. No. PCT/US2020/038060, dated Sep. 21, 2020, Korean Intellectual Property Office, Seo-gu, Daejeon, Republic of Korea, 10pgs.

*Primary Examiner* — Tha-O H Bui
(74) *Attorney, Agent, or Firm* — Holland & Hart LLP

(57) ABSTRACT

Methods, systems, and devices for digit line management for a memory array are described. A memory array may include a plate that is common to a plurality of memory cells. Each memory cell associated with the common plate may be coupled with a respective digit line. One or more memory cells common to the plate may be accessed by concurrently selecting the plate and each digit line associated with the plate. Concurrent selection of all digit lines associated with the plate may be supported by shield lines between the selected digit lines. Additionally or alternatively, selection of all digit lines associated with the plate may be supported by improved sensing schemes and related amplifier configurations.

20 Claims, 13 Drawing Sheets

(56) References Cited

U.S. PATENT DOCUMENTS

| | | |
|---|---|---|
| 2004/0095823 A1 | 5/2004 | Tam |
| 2007/0047286 A1* | 3/2007 | Miki ...................... G11C 11/22 |
| | | 257/E21.664 |
| 2013/0051109 A1 | 2/2013 | Madan |
| 2018/0331114 A1* | 11/2018 | Vimercati .............. G11C 5/025 |
| 2019/0189190 A1 | 6/2019 | Di Vincenzo et al. |

* cited by examiner

DIGIT LINE MANAGEMENT FOR A MEMORY ARRAY

CROSS REFERENCE

The present application for patent is a continuation of U.S. patent application Ser. No. 16/450,033 by Guo et al., entitled "DIGIT LINE MANAGEMENT FOR A MEMORY ARRAY" filed Jun. 24, 2019, assigned to the assignee hereof, and is expressly incorporated by reference in its entirety herein.

BACKGROUND

The following relates generally to a system that includes at least one memory device and more specifically to digit line management for a memory array.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
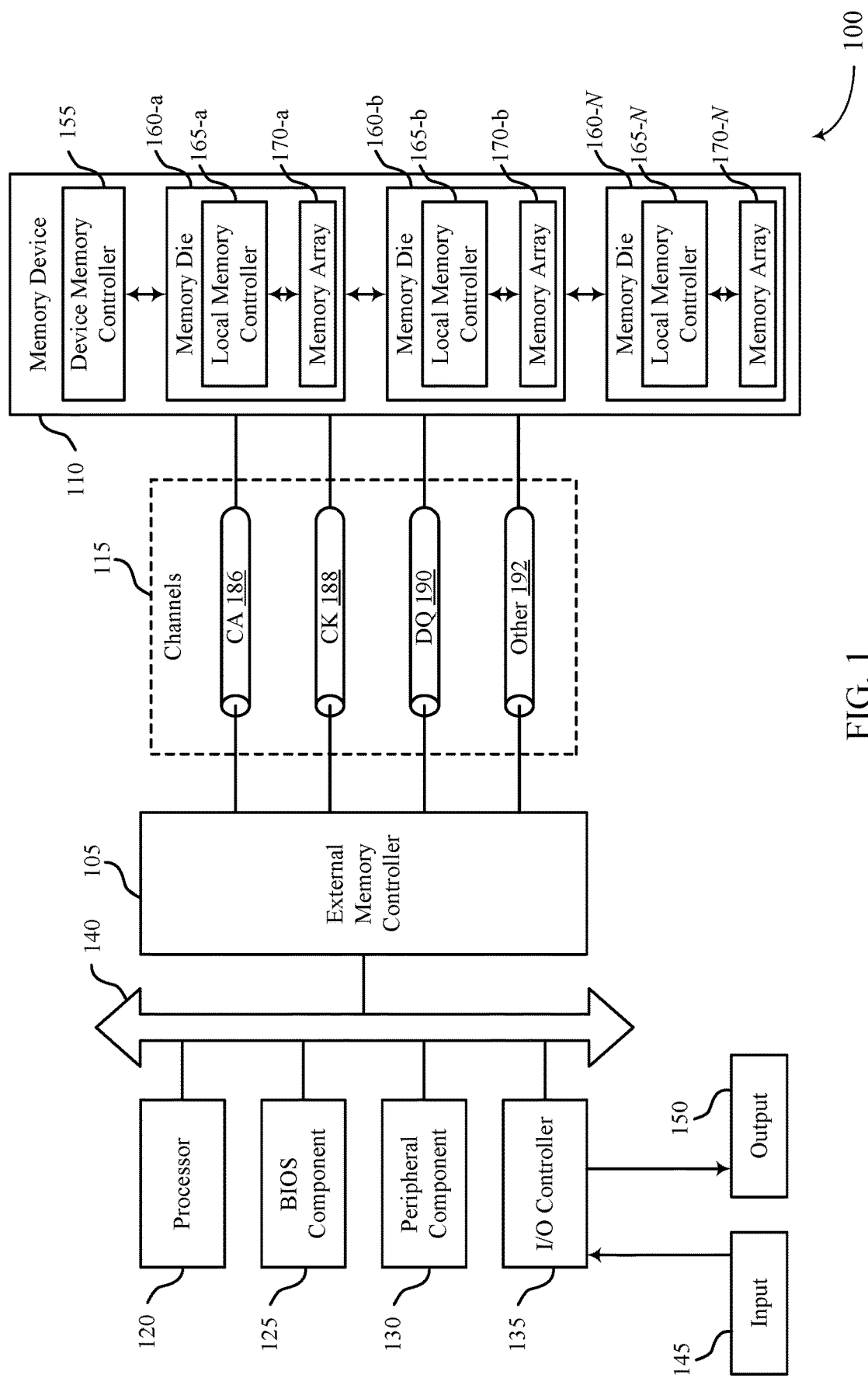
FIG. 1 illustrates an example of a system that supports digit line management for a memory array in accordance with examples as disclosed herein.

The logic states of multiple memory cells may be detected concurrently using a read or sense operation in accordance with aspects of the present disclosure. In some memory architectures, a memory cell (e.g., a ferroelectric memory cell) may be coupled with a digit line, word line, and plate (e.g., a plate coupled with a plate line). In some cases, a single plate may be common to (e.g., shared by, coupled with) multiple ferroelectric memory cells. This may, for example, reduce the complexity of control schemes and related circuitry (e.g., decoder circuitry) compared to each memory cell having a unique, separately controlled plate.

A single memory array may include one or more patches, and each patch may include any number of plates. Further, the plates within a patch may be grouped into any number of plate groups (e.g., units, sets of plates). For example, a patch may include 10 plate groups, and each plate group may include 32 plates. These and other numeric examples used herein are purely for illustrative clarity and are only examples; any numeric example herein is not to limit the scope of the claims. In some cases, as part of a set of concurrent access operations (e.g., concurrent read or write operations for multiple memory cells within the array), one plate within each plate group may be activated (selected), and one or more memory cells coupled therewith may be activated—for example, multiple plates within a patch may be activated concurrently, but each concurrently activated plate may be within a different plate group, with one plate activated for each plate group.

Each plate may be common to any number of memory cells. Thus, in an array in which the memory cells are arranged into columns and rows, the memory cells that share (correspond to, have) a same plate may include (be arranged in) any number of columns and rows. Each row of memory cells may correspond to (e.g., be coupled with) a same word line, and each column of memory cells may correspond to (e.g., be coupled with) a same digit line. In some cases, word lines may span multiple plates (e.g., may run across all the plate groups and thus all the plates in the patch). For example, memory cells of the array may be arranged in rows that each span multiple plates and multiple plate groups, and each such row may correspond to a same word line. In some cases, digit lines may each be specific to one plate. For example, memory cells of the array may be arranged in columns that are each dedicated to (specific to) one plate (e.g., columns may not span plate boundaries). Thus, a digit line that corresponds to a column of memory cells having (sharing) a common plate may be referred to as a digit line for (associated with, corresponding to) the plate. For example, each plate may be associated with 8 columns of memory cells and thus 8 digit lines.

In some memory architectures, it may not be possible (at least without undesired performance impacts) to concurrently select (activate, access memory cells coupled with) each digit line (all digit lines) for a plate. For example, selecting adjacent digit lines may result in unintended cross-coupling effects (e.g., capacitive cross-coupling or crosstalk) between the two selected digit lines. When cross-coupling occurs, data read from or to be written to a memory cell of the selected digit line may be corrupted. Accordingly, in such architectures, only a subset of digit lines (e.g., every other digit line, every fourth digit line, or other non-adjacent digit lines) associated with a selected plate may be selected concurrently, with one or more unselected digit lines between each pair of selected digit lines.

Where only a subset of digit lines corresponding to a plate are selected, a physically larger plate may be used in order to accommodate a larger number of digit lines associated with the plate—e.g., so that a desired total number of concurrently selected digit lines (bandwidth) per plate may be achieved without selecting adjacent digit lines. For example, if it is desired to concurrently access 8 memory cells per selected plate, for a one byte bandwidth per selected plate, and if only every fourth digit line corresponding to a plate is concurrently selected, then the plate must correspond to at least 32 digit lines, which may result in the plate being physically larger than were the plate able to correspond to only the 8 selected digit lines. The power required to select (e.g., increase or decrease the voltage of) a plate may be directly proportional to its physical size, and thus a physically larger plate (e.g., a plate that corresponds to more digit lines) may result in increased power consumption of the array.

Further, when only a subset of digit lines corresponding to a plate are selected, and the voltage of a selected plate increases or decreases as part of an access operation, unselected digit lines corresponding to the plate may be shunted (shorted, coupled) to the plate. This shunting may be intended to maintain a constant (e.g., zero) voltage differential across unselected memory cells (memory cells coupled with the unselected digit lines) as the voltage of the selected plate changes. However, as the voltage of the selected plate changes, the voltage of a shunted (unselected) digit line may follow the voltage of the plate with some delay (lag)—e.g., due to resistive-capacitive (RC) effects or other properties of the plate (and associated plate line) and the digit line. While the selected plate voltage is increasing or decreasing, this lag may result in an undesired change in (e.g., increase in) the voltage differential between the selected plate and the shunted digit line, at least until the digit line voltage reaches the final plate voltage. Further, the faster the plate voltage changes (the greater the rate of increase or decrease of the voltage, or slew rate), the greater the undesired change in the voltage differential between the selected plate and the shunted digit line may be (e.g., the greater the differential may become while the plate voltage is changing).

Thus, in some memory architectures, the speed (rate) at which the plate voltage is changed—that is, the slew rate for the plate voltage—may be limited (controlled, artificially slowed) in an effort to reduce the voltage differential between the selected plate and shunted (unselected) digit lines for the selected plate and thereby reduce the risk of disturb for memory cells coupled with the shunted digit lines. Limiting the slew rate for the plate voltage may increase the amount of time required for access operations for memory cells to which the plate is common (e.g., may increase a row cycle time (tRC) or other time interval associated with an access operation), and thus may slow the overall speed at which reads, writes, and other accesses may occur.

Further, in some memory architectures, the voltage of a selected digit line may increase or decrease (toggle) as part of an access operation. When only a subset of digit lines corresponding to a plate are selected, the toggling voltages of the selected digit lines may disturb memory cells coupled with unselected digit lines corresponding to the plate (e.g., due to capacitive coupling between the digit lines). Thus, in some memory architectures, the speed (rate) at which the voltage of a selected digit line is changed—that is, the slew rate for the digit line voltage—may be limited (controlled, artificially slowed) in an effort to reduce the risk of disturb for memory cells coupled with the unselected digit lines. Like limiting the slew rate for the plate voltage, however, limiting the slew rate for the digit line voltage may increase the amount of time required for access operations for memory cells to which the plate is common (e.g., may increase a row cycle time (tRC) or other time interval associated with an access operation), and thus may slow the overall speed at which reads, writes, and other accesses may occur.

Accordingly a sensing scheme that allows for adjacent digit lines, including adjacent digit lines associated with a common plate, to be selected and accessed concurrently (e.g., simultaneously), such as the sensing schemes described herein, may be beneficial. For example, such a sensing scheme may reduce power consumption—e.g., by allowing a plate to correspond only to the number of digit lines that are desired to be selected for an access operation, and thus for the physical size of the plate to be reduced compared to some memory architectures in which, for a selected plate, only a subset of the corresponding digit lines are selected. As another example, such a sensing scheme may allow for faster access (e.g., read or write) operations— e.g., by allowing a faster (e.g., uncontrolled) slew rate for plates and digit lines compared to some memory architectures in which, for a selected plate, only a subset of the corresponding digit lines are selected. These and other benefits may be appreciated by one of ordinary skill in the art.

In some examples, digit lines common to a plate may be separated by one or more shield lines. A shield line may refer to any conductive line that may be grounded in order to protect (e.g., "shield") adjacent digit lines from unintended cross-coupling effects. Unlike digit lines, shield lines may be electrically isolated from (not coupled with) any memory cells. Further the voltage of a shield line may not be selectable (controllable)—e.g., the shield line may be hard-wired to ground or to a virtual ground. For example, a memory array as described herein may include ten plate groups and each plate group may include 32 plates. In some examples, each plate may be associated with 8 digit lines and at least 2 of the digit lines may be separated from each other by a shield line. As used herein, digit lines may be referred to as being separated by a shield line when a shield line is located between the digit lines or otherwise configured to electrically isolate one of the digit lines from another of the digit lines. In other examples, any subset of the digit lines (including each of the 8 digit lines) may be separated by a shield line. Because each shield line may be grounded, each digit line may be selected concurrently without experiencing any unintended cross-coupling. That is, the shield lines may allow for the voltage of the plate to be increased or decreased, each digit line to be concurrently selected, and access operations to be performed on any one or more concurrently selected memory cells. Selecting each digit line concurrently and performing an access operation on one or more of the memory cells may support decrease power consumption of the memory array, and may improve the time needed to access the memory cells associated with a single plate, among other benefits.

Additionally or alternatively, the architecture of the sense amplifiers used to sense the memory cells may support each of the digit lines common to a plate being selected concurrently. In order to sense a memory cell, a respective digit line may be selected and a signal may be transmitted along the selected line. For example, to sense a logic state stored at a memory cell, a digit line may be selected and a signal corresponding to the logic state of the memory cell may be transmitted along the digit line and to a sense amplifier. Based on a value of the signal received (e.g., based on a relative voltage value of the signal), the sense amplifier may be able to determine the stored logic state.

Sense amplifiers in accordance with aspects of the present disclosure may be high-gain sense amplifiers configured to sense—compared to some sense amplifiers—smaller changes in the voltages of the digit lines, which may support the use of lower voltage swing (lower swing) signals on the digit lines. By using lower swing signals on the selected digit lines, cross-coupling effects may be reduced. Further, due to the structure of the sense amplifiers (e.g., by using higher-gain sense amplifiers), the voltage values associated with one or more memory cells may be accurately sensed concurrently. Thus, sense amplifiers as described herein may support selecting each digit line concurrently and performing an access operation on one or more of the associated memory cells, which may decrease power consumption of the memory array, and may improve the time needed to access the memory cells associated with a single plate, among other benefits.

Features of the disclosure are initially described in the context of a memory system. Features of the disclosure are described in the context of a memory array, a circuit, and a timing diagram that support digit line management for a memory array in accordance with examples as disclosed herein. These and other features of the disclosure are further illustrated by and described with reference to apparatus diagrams, system diagrams, and flowcharts that relate to digit line management for a memory array.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. For example, one or more memory arrays 170 may include a plurality of shield lines that are configured to isolate one or more selected access lines (e.g., one or more selected digit lines). In some examples, the shield lines may mitigate (e.g., prevent) unintended cross-coupling (e.g., capacitive cross-coupling or crosstalk) between adjacent selected access lines. In other examples, one or more memory arrays 170 may be coupled with a sense amplifier (e.g., a high gain sense amplifier) that is configured to provide high gain sensing while operating in a linear region of the amplifier or otherwise reducing (e.g., removing) signal saturation. For example, each access line (e.g., each digit line) associated with a same plate of a memory array 170 may be selected, and at least one memory cell may be sensed while the access lines are selected. The sense amplifier (e.g., the high gain sense amplifier) may support the use of low swing signaling on access lines (e.g., relatively small variations in digit line voltage, such as changes dependent on a sensed logic state), which may mitigate (e.g., prevent) unintended cross-coupling between adjacent selected access lines, and which may also result in the memory cell being more-accurately sensed.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK t signal and a CK c signal) and the signal paths of the CK channels 188 may be configured accordingly. In some cases, the clock signal may be single ended. A CK channel 188 may include any quantity of signal paths. In some cases, the clock signal CK (e.g., a CK t signal and a CK c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

Figure 2:
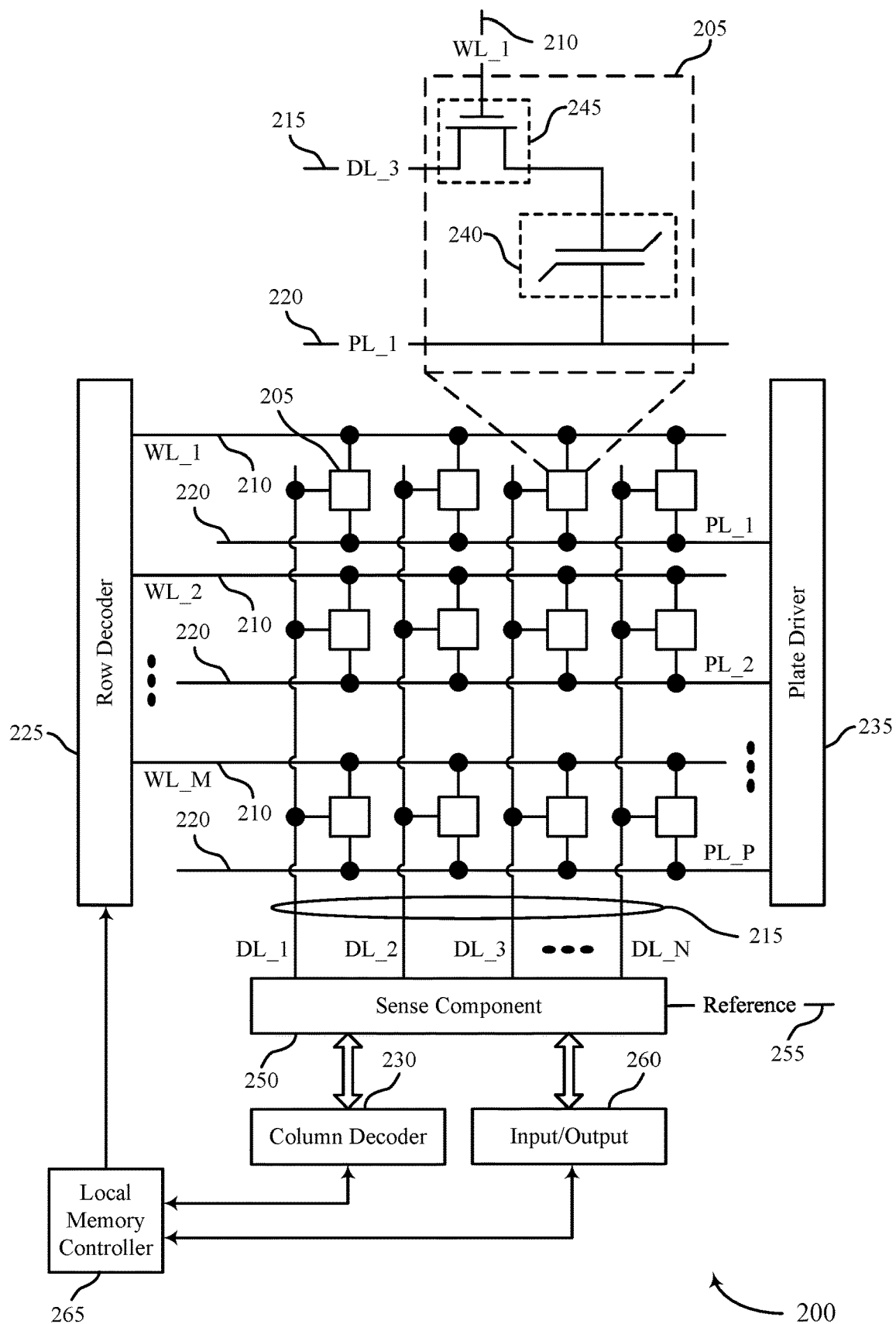
FIG. 2 illustrates an example of a memory die that supports digit line management for a memory array in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

In some examples, as described herein, a plate (e.g., a plate line 220 coupled with a plate) may be selected (e.g., its voltage may be increased or decreased). Each plate of a memory array may be associated with a plurality of digit lines 215. In some examples, upon selecting the plate, each corresponding digit line may be selected (e.g., selected simultaneously) and memory cells 205 associated with the selected digit lines may be accessed. As described herein, the presence of one or more shield lines and/or the configuration of one or more sense amplifiers (e.g., a high gain sense amplifier) being coupled with the selected digit lines may support the concurrent selection of each digit line associated with a plate (and the accessing of one or more associated memory cells). In some examples, the shield lines and/or the configuration of the sense amplifiers may reduce any unintended cross-coupling between selected digit lines 215, which may preserve the integrity of data read from or written to selected memory cells 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215. As described herein, a single plate (e.g., a single plate line 220) may be coupled with a plurality of digit lines 215. In some examples, one or more digit lines 215 coupled with a same plate may be separated by a shield line. In some examples, a shield line may be or may be referred to as a "dummy" digit line, though unlike a digit line 215, the shield line may not be coupled with any memory cell 205 and may be grounded. Accordingly, both digit lines may be selected simultaneously, and a shield line may separate two otherwise adjacent digit lines 215, which may reduce any disturbance between the selected digit lines 215 that may otherwise occur. Additionally or alternatively, as described herein, one or more digit lines 215 (e.g., one or more selected digit lines 215) may be coupled with a respective sense amplifier (e.g., as described with reference to FIGS. 8 and 9). In some examples, each sense amplifier may be configured to be coupled with a selected digit line 215 of a plate during an access operation.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205. As described with reference to FIG. 5, a memory device may include a patch that includes a plurality of plates. In some examples, the plates within a patch may be grouped into any number of plate groups (e.g., units, sets of plates). Each plate group may include a plurality of plates, and each plate may be associated with a plurality of columns of memory cells 205 and thus with a plurality of digit lines. For example, a patch may include ten (10) units, and each unit may include thirty-two (32) plates. Each plate may be associated with eight (8) digit lines 215. In some cases, within each plate group, one plate may be activated (selected, access memory cells coupled therewith) as part of an access operation (e.g., read or write operation)—for example, multiple plates within a patch may be activated concurrently, but each concurrently activated plate may be within a different plate group, with one plate activated in each plate group.

The sense component 250 may be configured to determine a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

As described herein, a memory device may include one or more sense components that are configured to sense one or more memory cells 205 while a plurality of adjacent digit lines 215 are selected. For example, each digit line 215 associated with a plate (e.g., a plate line 220) may be selected at a same time. Each selected digit line 215 may be coupled with a respective sense amplifier included in the sense component 250. In some examples, each sense amplifier may be configured to sense smaller changes in the voltage values of the digit lines 215 (e.g., configured to support the use of lower swing signaling on the digit lines). In some examples, each sense amplifier may be configured to sense one or memory cells 205 associated with the selected digit lines 215 while reducing or eliminating any signal disturbance (e.g., crosstalk).

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., by applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state. In some examples, as described herein, a write operation may occur on one or more memory cells 205 associated with a plate (e.g., a plate line 220) having each of its digit lines 215 selected. That is, each digit line 215 associated with a plate (e.g., a plate line 220) may be selected at a same time, and a write operation may occur on one or more memory cells 205 associated with the selected digit line.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., by applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation. In some examples, as described herein, a read operation may occur on one or more memory cells 205 associated with a plate (e.g., a plate line 220) while each of the digit lines corresponding to the plate are 215 selected. That is, each digit line 215 associated with a plate (e.g., a plate line 220) may be selected at a same time, and a read operation may occur on one or more memory cells 205 associated with the selected digit lines.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3A:
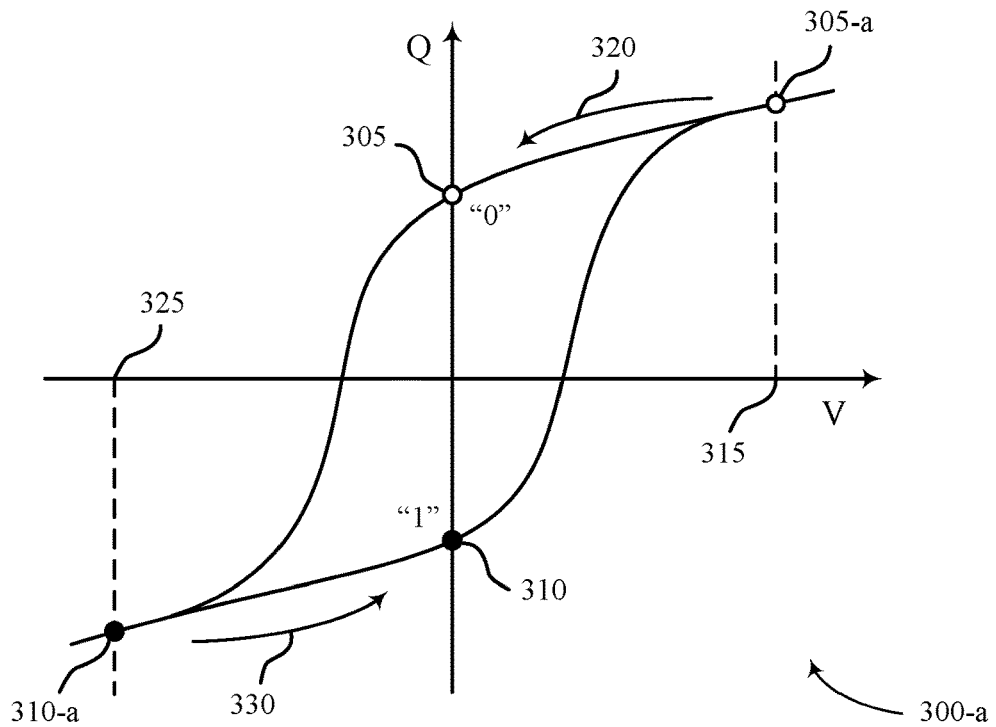
FIGS. 3A and 3B illustrate examples of hysteresis curves that support digit line management for a memory array in accordance with examples as disclosed herein.
Figure 3B:
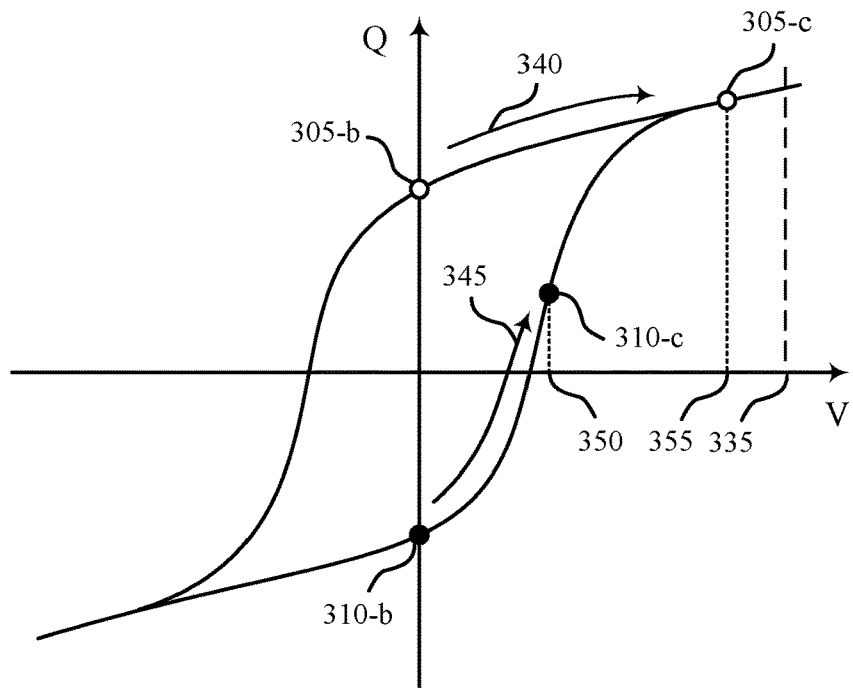

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-*a* and 300-*b* represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-*a* is reached. Upon removing voltage 315, charge state 305-*a* follows path 320 until it reaches charge state 305 at zero voltage. Similarly, charge state 310 is written by applying a net negative voltage 325, which results in charge state 310-*a*. After removing negative voltage 325, charge state 310-*a* follows path 330 until it reaches charge state 310 at zero voltage. Charge states 305-*a* and 310-*a* may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the different between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, a ferroelectric memory cell may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction. In some cases, a ferroelectric memory cell may lose its initial logic state after a read operation. For example, if charge state 310-*b* is stored, the charge state may follow path 345 to charge state 305-*c* during a read operation and, after removing voltage 335, the charge state may relax to the charge state 305-*b* by following path 340.

Hysteresis curve 300-*b* illustrates an example of reading a memory cell that is configured to store the charge state 305-*b* and the charge state 310-*b*. A read voltage 335 may be applied, for example, as a voltage difference via a digit line 215 and a plate line 220 as described with reference to FIG. 2. Hysteresis curve 300-*b* may illustrate read operations where the read voltage 335 is negative voltage difference Vcap (e.g., where Vbottom—Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-a (e.g., a logic 1) or at charge state 310-a (e.g., a logic 0).

Figure 4:
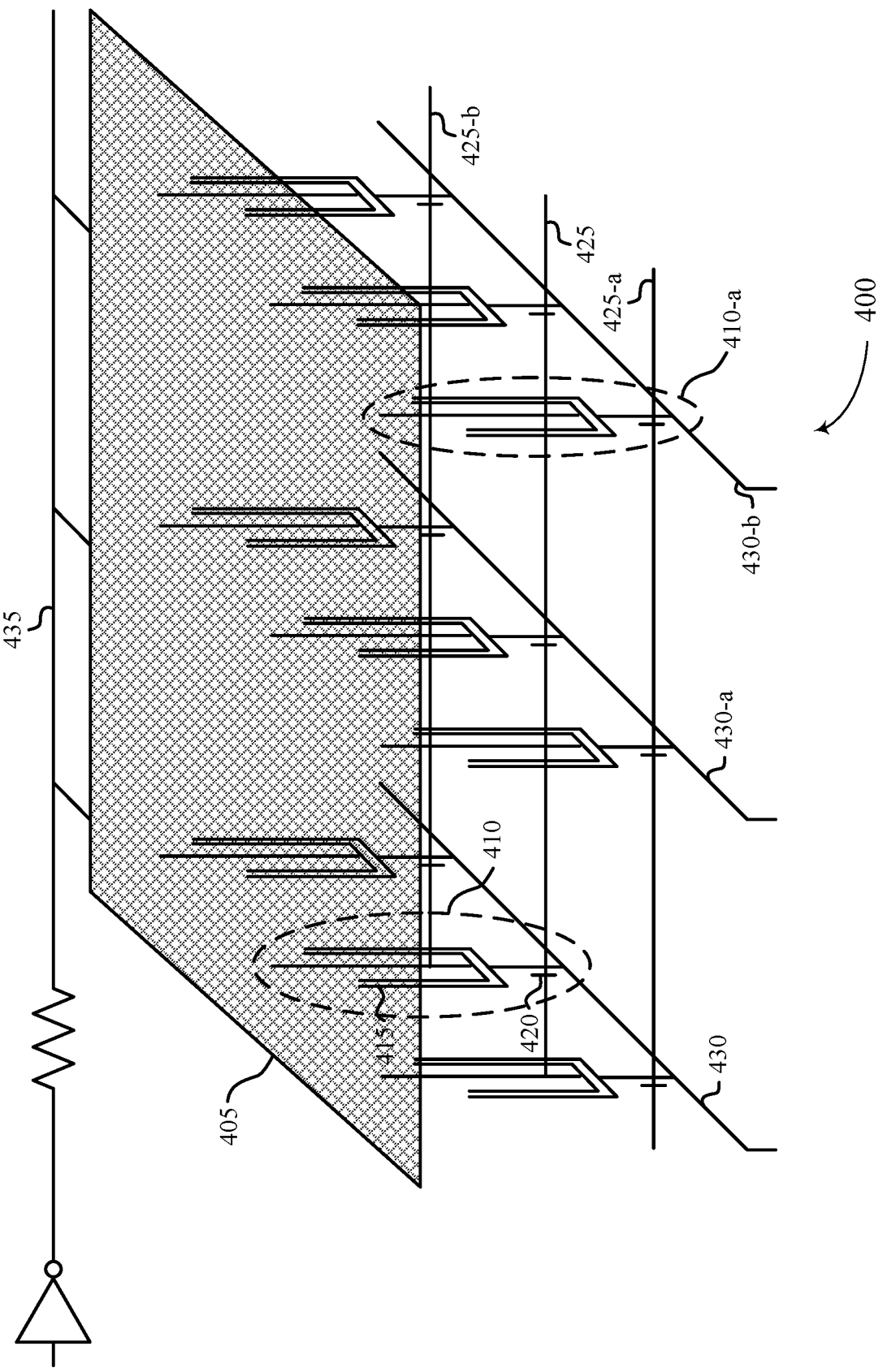
FIG. 4 illustrates an example of a memory array that includes a common plate that supports digit line management for a memory array in accordance with examples as disclosed herein.

FIG. 4 illustrates an example of a memory array 400 that includes a common plate and supports digit line management for a memory array in accordance with examples as disclosed herein. In some examples, the memory array 400 may be or may represent a portion of a larger memory array. As shown with reference to FIG. 4, the memory array may include a plate 405, a plurality of memory cells (e.g., including memory cell 410 and memory cell 410-a), a plurality of word lines (e.g., including word line 425, word line 425-a, and word line 425-b), a plurality of digit lines (e.g., including digit line 430, digit line 430-a, and digit line 430-b) and a plate line 435. In some examples, each memory cell may include a transistor or other selector device (e.g., transistor 420 of memory cell 410) and a capacitor (e.g., capacitor 415 of memory cell 410). Additionally or alternatively, the memory array 400 may include a plate line 435 that is coupled with the plate 405 and also may include one or more shield lines (not shown).

As described herein, a memory cell may be located at an intersection of a word line and a digit line. For example, memory cell 410 may be located at the intersection of word line 425 and digit line 430. The memory cell 410 may include a logic storage component, such as capacitor 415, and a transistor 420 (e.g., a switching or selection component). The capacitor 415 may be an example of a ferroelectric capacitor. A first node of the capacitor 415 may be coupled with the transistor 420 and a second node of the capacitor 415 may be coupled with the plate 405. To access the memory cell 410, the plate 405, the digit line 430, and the word line 425 may be selected (e.g., by adjusting the respective voltages of the plate 405, the digit line 430, and the word line 425). In some examples, the plate 405 may be selected by applying a voltage to the plate 405 via the plate line 435.

In some examples, the plate 405 may be common to a plurality of memory cells. That is, the plate 405 may be common to at least the memory cell 410 and the memory cell 410-a. As described with reference to FIG. 5, the plate 405 may be or may represent a single plate that is included in a unit (e.g., a plate group that includes a plurality of plates), and each unit may be included in a patch (e.g., a patch, which may also be referred to as a tile, or other array subsection that includes a plurality of plate groups). In some examples, the plate 405 may be located above each of the plurality of memory cells of the memory array 400. Stated another way, each memory cell of the memory array 400 may be located below the plate 405 (e.g., below the plate 405 that is common to each of the memory cells). In other examples, the plate 405 may be located below each of the plurality of memory cells of the memory array 400, and each memory cell of the memory array 400 may be located above the plate 405 (e.g., above the plate 405 that is common to each of the memory cells).

In order to access a memory cell of the memory array, a respective voltage may be applied to the plate 405, to a digit line, and to a word line. For example, in order to access memory cell 410, a respective voltage may be applied to the plate 405 (via the plate line 435), to the digit line 430, and to the word line 425. In some examples, applying a voltage to the digit line 430 may be referred to as selecting the digit line 430. However, the memory cell may be accessed only when a respective word line (e.g., word line 425) is also selected, which may result in a voltage being applied to a gate of a transistor (selection device) of each memory cell coupled with the digit line 430.

In some examples, it may be beneficial to mitigate unintended interference between adjacent selected lines. For example, selecting digit line 430 and digit line 430-a concurrently may risk cross-coupling between the selected digit lines, and thus may risk unwanted data corruption. However, as described herein, one or more shield lines may be located between the digit lines of a memory array (e.g., between digit line 430 and digit line 430-a, and between digit line 430-a and digit line 430-b) such that cross-coupling effects may be mitigated and each of the digit lines may be selected concurrently without undesirable performance impacts. Selecting each of the digit lines concurrently may also allow for the memory array to consume less power (e.g., by allowing the plate 405 to correspond only to the number of digit lines that are desired to be concurrently selected for one or more access operations, and thus for the physical size of the plate 405 to be reduced compared to some memory architectures in which, for a selected plate, only a subset of the corresponding digit lines are selected). Further, the sensing scheme and crosstalk mitigation techniques described herein may allow for faster access (e.g., read or write) operations (e.g., by allowing slew rates for plate and digit line voltages to be increased).

Figure 5:
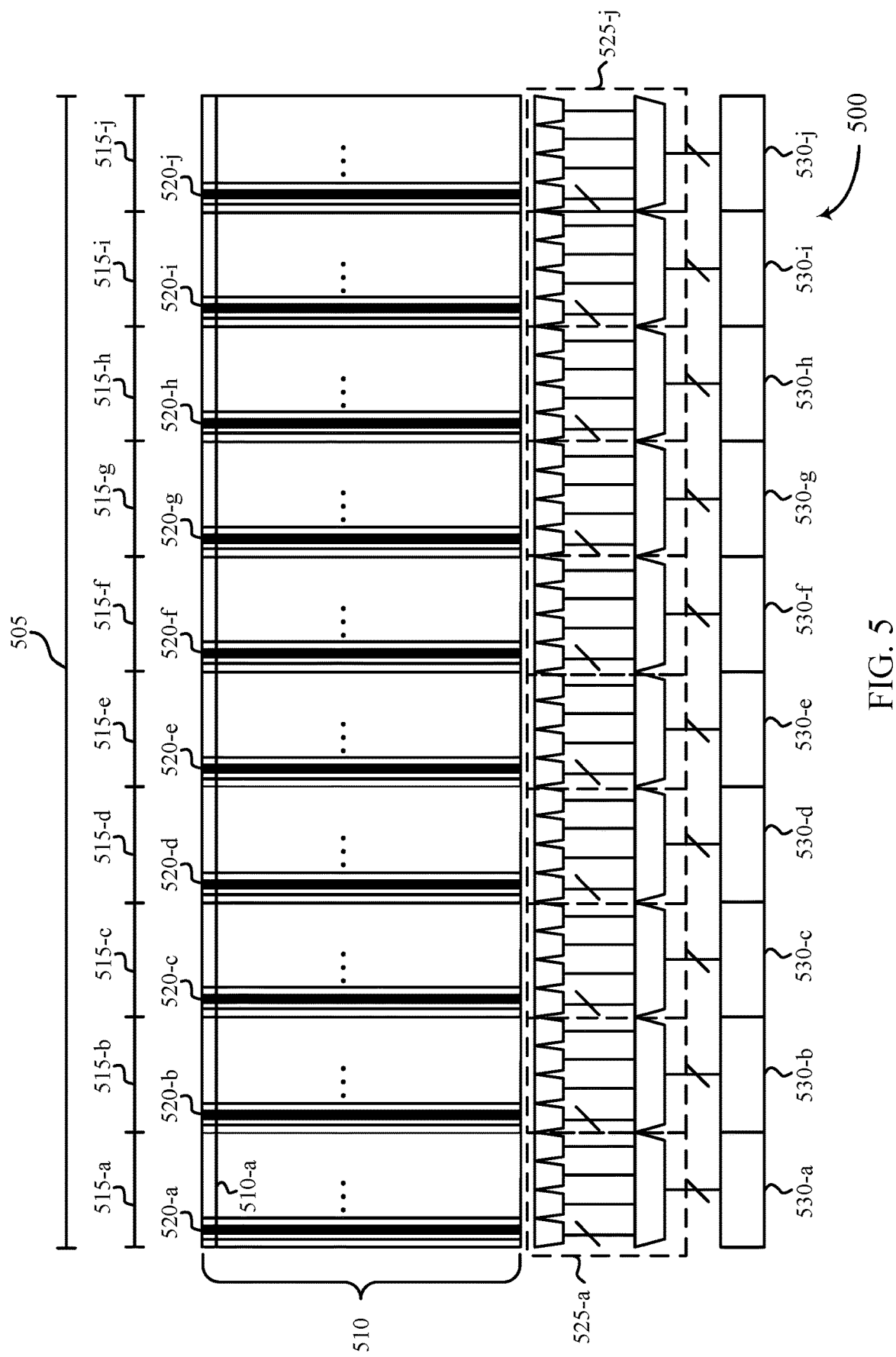
FIG. 5 illustrates an example of a memory array that includes a plate that supports digit line management for a memory array in accordance with examples as disclosed herein.

FIG. 5 illustrates an example of a memory array 500 that supports digit line management for a memory array in accordance with examples as disclosed herein. As shown with reference to FIG. 5, the memory array may include a patch 505, which may include a plurality of units 515 (e.g., unit 515-a through unit 515-j). In some examples, each unit 515 may include a plurality of plates 520 that may be referred to as a plate group. For example, unit 515-a may include a plurality of plates, among them plate 520-a. Each of the plates 520 may be one example of the plate 405 as described with reference to FIG. 4. That is, each plate 520 may be coupled with (e.g., common to) a plurality of memory cells comprising a plurality of rows and columns, each row coupled with a respective word line and each column coupled with a respective digit line. In some examples, the memory array 500 may include word lines 510, such as word line 510-a, which may span multiple plates 520 and multiple plate groups 515 (e.g., may be coupled with memory cells associated with multiple plates in multiple plate groups).

The memory cells coupled with a plate 520 may comprise any number of columns, and thus each plate 520 may be associated with any number of digit lines. Each digit line associated with a selected plate may be configured to be selected concurrently (e.g., simultaneously) during an access operation. In order to access a set of memory cells associated with a particular plate, the plate may be selected by applying a voltage to a plate line (e.g., plate line 435 as described with reference to FIG. 4) that is coupled with the plate 520. The voltage of the plate 520 may increase (e.g., the plate may be taken "high") and each of the digit lines associated with the plate 520 may be concurrently selected. A particular word line 510 may then be selected, and the memory cells at the intersections of the selected digit lines and the selected word line 510 may be accessed (e.g., if eight (8) digit lines correspond to the selected plate 520, then eight (8) memory cells may be accessed concurrently by concurrently selecting the plate 520, all eight (8) of the corresponding digit lines, and the word line 510 coupled with the eight (8) memory cells).

As described with reference to FIG. 4, it may be beneficial to mitigate any disturbance (e.g. crosstalk) caused by adjacent digit lines being selected. Accordingly, in some examples, such as described with reference to FIG. 6, one or more shield lines may be employed in a memory array to mitigate such electrical disturbance. In some examples, a shield line may be or may include a grounded segment (e.g., metal segment) that "shields" (e.g., electrically isolates from one another, is located between, separates) adjacent access lines (e.g., adjacent digit lines). Thus, the presence of the shield lines may allow for each digit line associated with a common plate (e.g., plate 520-*a*) to be selected at a same time during an access operation with reduced crosstalk, resulting in multiple memory cells being selected concurrently with reduced crosstalk and other disturbances.

In some examples, the memory array 500 may also include a plurality of multiplexing components (e.g., multiplexing component 525-*a* through multiplexing component 525-*j*) that are each coupled with a respective unit (e.g., respectively coupled with each plate group) and with a respective set of sense amplifiers (e.g., respectively coupled with one of set of sense amplifiers 530-*a* through set of sense amplifiers 530-*j*). In some examples, each multiplexing component (e.g., multiplexing component 525-*a*) may be configured to concurrently couple all the digit lines for a selected plate 520 to a different sense amplifier within the respective set of sense amplifiers (e.g., one of set of sense amplifiers 530-*a* through set of sense amplifiers 530-*j*) that corresponds to the plate group 515 that includes the selected plate 520.

In some examples, each multiplexing component (e.g., multiplexing component 525-*a*) may include any number and arrangement of individual multiplexers. For example, a multiplexing component 525-*a* may include a cascaded network of multiplexers. Using example numbers purely for the sake of illustrative clarity, for example, one or more multiplexers may be configured as a 32:1 multiplexer with 8-wide buses as inputs and outputs. For example, a multiplexing component 525-*a* may include a set of four (4) 8:1 multiplexers in parallel with one another and a 4:1 multiplexer in series with the set of 8:1 multiplexers, with each multiplexer having 8-wide buses as inputs and outputs, with the set of 8:1 multiplexers configured to route (couple) all eight (8) of the digit lines for one selected plate 520 within a unit 515 that includes thirty-two (32) plates to the 4:1 multiplexer, and with the 4:1 multiplexer configured to route (couple) all eight (8) of the digit lines for one selected plate 520, in respective fashion, with the eight (8) sense amplifiers included in the set of sense amplifiers 530 corresponding to the unit 515.

For example, and using example numbers only for illustrative clarity, eight (8) sense amplifiers (e.g., as included in a respective set of sense amplifiers 530) may be coupled with each multiplexing component 525. Accordingly, one plate from each unit 515 may be selected concurrently (e.g., each of plates 520-*a* through 520-*j* may be selected). Concurrently, for each selected plate 520, which may be associated with eight (8) digit lines: Each of the eight (8) associated digit lines may be concurrently selected, and the respective multiplexing component (e.g., one multiplexing component 525) may couple each of the eight (8) selected digit lines to a respective sense amplifier within the respective set of sense amplifiers 530. Thus, in some examples, when each of plate 520-*a* through plate 520-*j* is selected, eighty (80) digit lines may be concurrently selected and may be concurrently coupled—respectively, in a 1:1 relationship—with the eighty (80) sense amplifiers collectively included in the ten (10) illustrated sets of sense amplifiers 530.

Figure 6:
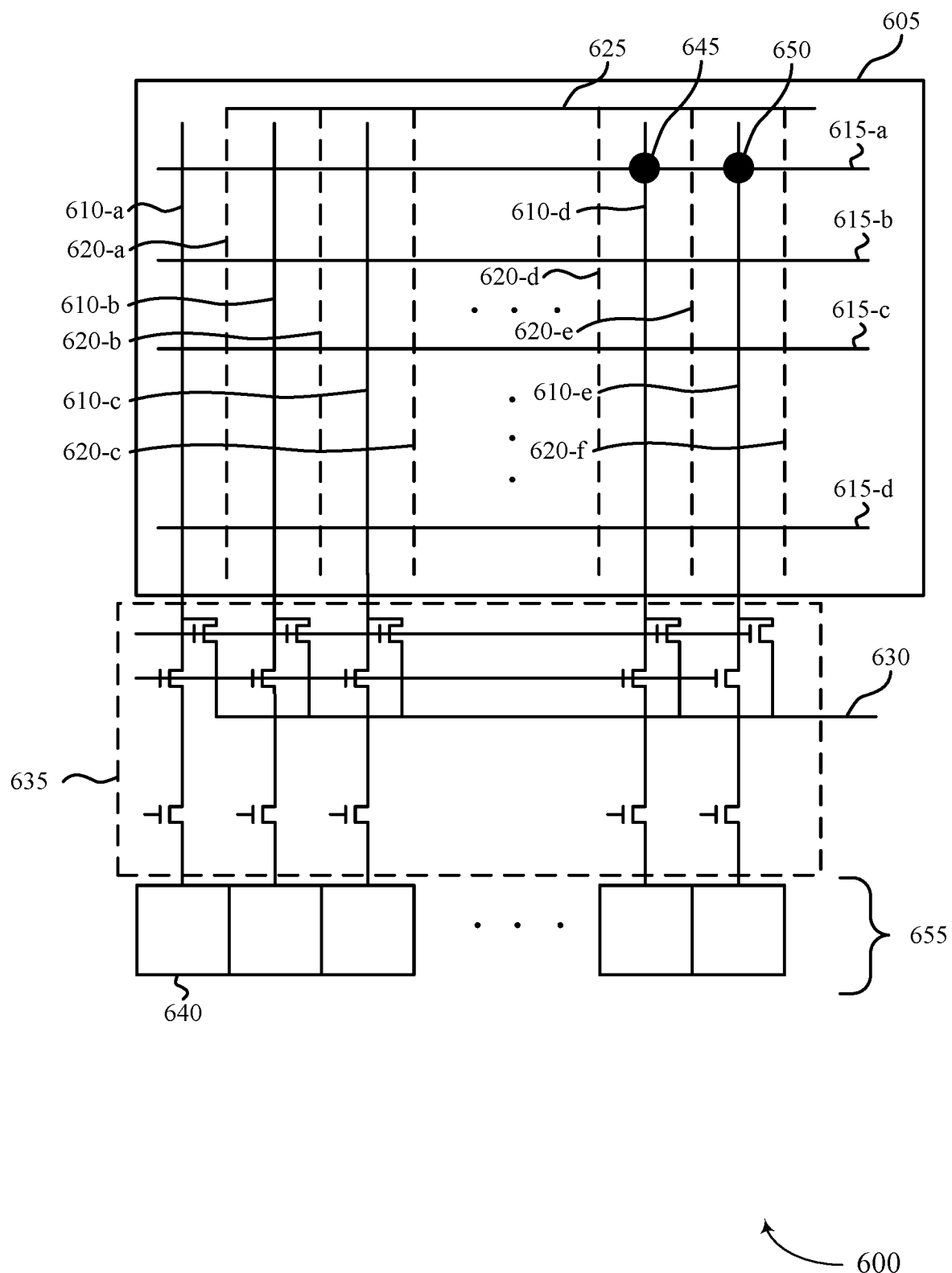
FIG. 6 illustrates an example of a memory array that includes a selected plate that supports digit line management for a memory array in accordance with examples as disclosed herein.

FIG. 6 illustrates an example of a memory array 600 that includes a selected plate that supports digit line management for a memory array in accordance with examples as disclosed herein. In some examples, the memory array 600 may include a plate 605 (e.g., a selected plate), which may be an example of a plate 520 as described with reference to FIG. 5. That is, the plate 605 may be or may represent one of a plurality of plates that are associated with a single unit (e.g., a single plate group). In some examples, the unit may be one of a plurality of units of a single patch (e.g., patch 505 as described with reference to FIG. 5). In some examples the plate 605 may correspond to a plurality of digit lines 610 (e.g., digit lines 610-*a* through 610-*e*), a plurality of word lines (e.g., word lines 615-*a* through 615-*d*), and a plurality of shield lines (e.g., shield lines 620-*a* through 620-*f*). In some examples, each digit line 610 may be coupled with a multiplexing component 635 that corresponds to the unit and is thus couplable (able to be coupled with) with a respective sense amplifier 640 within a set of sense amplifiers 655 that corresponds to the unit. The multiplexing component 635 may be an example of a multiplexing component 525, and the set of sense amplifiers 655 may be an example of a set of sense amplifiers 530 as described with reference to FIG. 5. Each respective sense amplifier 640 may be configured to sense one memory cell when a digit line associated with the plate 605 is selected and coupled with the sense amplifier 640.

As described herein, a plate (e.g., plate 605) common to a plurality of memory cells may be selected, and each digit line associated with the plate may be selected concurrently. For example, plate 605 may be selected (e.g., by applying a voltage to a plate line (not shown) coupled with the plate 605), which may result in a voltage across the plate 605 increasing. In some examples, each (all) of the digit lines corresponding to the plate 605 (e.g., digit line 610-*a* through 610-*e*) may be selected. Each of the digit lines may be selected at a same time (e.g., concurrently, simultaneously, for a same duration). In order to access a set of memory cells associated with the plate 605, a word line may be activated. For example, a first memory cell 645 (e.g., a first ferroelectric memory cell) may be located at the intersection of the word line 615-*a* and the digit line 610-*d* (e.g., the first digit line) and a second memory cell 650 (e.g., a second ferroelectric memory cell) may be located at the intersection of the word line 615-*a* and the digit line 610-*e* (e.g., the second digit line).

Because every digit line associated with the plate 605 may be selected during an access operation, the first memory cell 645 (e.g., in addition to various other memory cells associated with the memory array 600) and the second memory cell 650 may be accessed (e.g., concurrently) by selecting the word line 615-*a*. Thus, in some examples, an access operation may be performed on the first ferroelectric memory cell while the second digit line is selected. Stated another way, data may be written to or read from the first ferroelectric memory cell 645 while the digit line associated with the second ferroelectric memory cell 650 is selected (e.g., while the digit line 610-*a* is activated). In some examples, other memory cells associated with the memory array 600 may also be accessed at a same time that the first memory cell 645 and the second memory cell 650 are being accessed. For example, memory cells located at an intersection of a respective digit line and the word line 615-*a* may be accessed at a same time that the first memory cell 645 and the second memory cell 650 are being accessed (e.g., due to every digit line of the plate 605 being selected).

In some examples, a memory array may include one or more plates that are not selected during an access operation. For example, plate 605 may be selected while one or more plates (e.g., one or more plates that are the same or similar as the plate 605) may be unselected. In some examples, a corresponding plate signal line 630 may be used to bias each unselected plate. The unselected plate may be coupled with (e.g., shunted to) one or more corresponding digit lines (e.g., unselected digit lines). Biasing the unselected digit lines and unselected plates at a same voltage (e.g., by shunting them together) may mitigate any unintended electrical disturbance of associated memory cells.

As described herein, unintended electrical disturbance (e.g., cross-coupling) may occur when adjacent access lines are selected. However, the presence of the shield lines (e.g., shield lines 620-*a* through 620-*f*) may mitigate (e.g., negate, counteract) such effects. For example, the shield line 620-*a* may negate such effects between the digit line 610-*a* and the digit line 610-*b*, the shield line 620-*b* may negate such effects between the digit line 610-*b* and the digit line 610-*c*, the shield line 620-*c* may negate such effects between the digit line 610-*c* and the digit line 610-*d*, and the shield line 620-*e* may negate such effects between the digit line 610-*d* and the digit line 610-*e*. In some examples, each of the shield lines may be coupled with a voltage sink 625 (e.g., ground) in order to shield selected digit lines from each other.

Accordingly, during an access operation of the memory cell 645, the shield line 620-*e* may prevent unintended data corruption due to the digit line 610-*e* being concurrently selected. Stated another way, the presence of the shield line 620-*e* may allow for data to be written to or read from the memory cell 645 without disturbance from the adjacent, selected digit line 610-*e*. Each of the first memory cell 645 and the second memory cell 650 may be sensed concurrently. For example, the shield line 620-*e* may allow for a first signal to be transmitted to or from the first memory cell 645 (e.g., along the digit line 610-*d*). While the first signal is being transmitted, a second signal may be transmitted to or from the second memory cell 650 (e.g., along the digit line 610-*e*). As discussed herein, the grounded shield line 620-*e* may prevent data being read to or written from the first memory cell 645 and the second memory cell 650 from being corrupted.

In some examples, the plate 605 may be coupled with a multiplexing component 635 that is coupled with a respective plurality (set) of sense amplifiers 655. The respective plurality (set) of sense amplifiers 655 may include a plurality of sense amplifiers 640, which thus may be coupled with the multiplexing component 635. Accordingly, the multiplexing component 635 may couple each activated digit line with a respective sense amplifier 640 within the respective plurality (set) of sense amplifiers 655. Thus, in some examples, memory cells respectively associated with each of the selected digit lines (e.g., digit line 610-*a* through digit line 610-*e*) may be accessed concurrently.

As shown in FIG. 6, a plate 605 may correspond to any number of digit lines. For example, a plate may correspond to eight (8) digit lines and each digit line may be separated by (e.g., isolated by) a respective grounded conductive line (e.g., by a shield line). However, in other examples, a plate may correspond to any number of digit lines, and any combination of digit lines may be isolated from one other by a shield line. Additionally or alternatively, a plate may correspond to any number of multiplexing components and/or sense amplifiers that allow memory cells associated with the selected digit lines to each be concurrently (e.g., simultaneously) sensed.

Figure 7A:
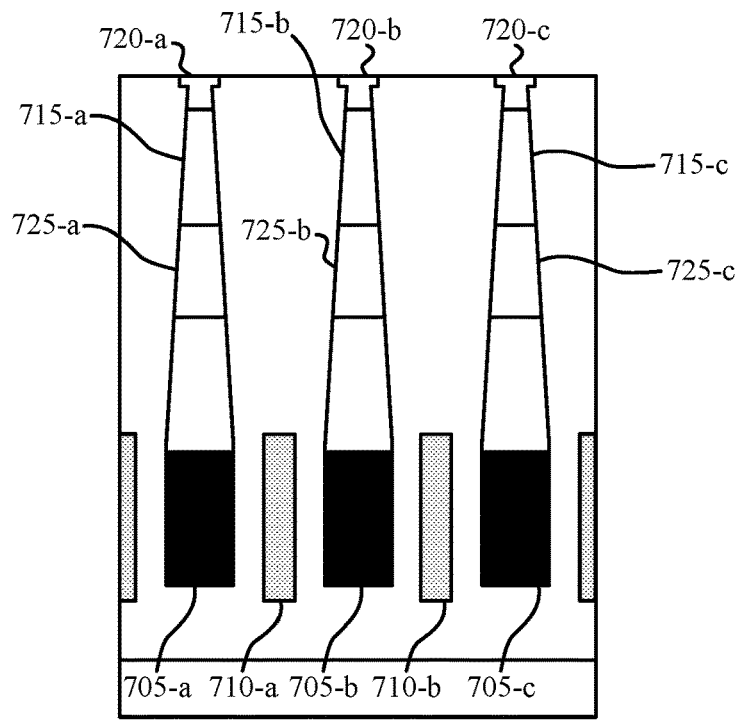
FIGS. 7A and 7B illustrate example shield lines that support digit line management for a memory array in accordance with examples as disclosed herein.

FIG. 7A illustrates an example of a memory array 700-*a* that supports digit line management for a memory array in accordance with examples as disclosed herein. In some examples, the memory array 700-*a* may illustrate the location of one or more shield lines (e.g., shield line 710-*a*, shield line 710-*b*) that are configured to isolate one or more digit lines (e.g., isolate digit line 705-*a* from digit line 705-*b*), which may be concurrently selected. Accordingly, the memory array 700-*a* may include digit lines 705-*a*, 705-*b*, and 705-*c* that are each coupled with a memory cell (e.g., with a transistor that is included in a memory cell, such as a transistor that comprises a selection device for the memory cell). For example, the digit line 705-*a* may be coupled with a transistor 715-*a* (e.g., a source of the transistor 715-*a*), the digit line 705-*b* may be coupled with a transistor 715-*b* (e.g., a source of the transistor 715-*b*), and the digit line 705-*c* may be coupled with a transistor 715-*c* (e.g., a source of the transistor 715-*c*). In some cases, each transistor 715 (e.g., a drain of each transistor) may be coupled with a respective capacitor (e.g., capacitor 720-*a* through 720-*c*), which may be a storage element within a memory cell that includes the transistor, such as a ferroelectric capacitor. In some examples, each transistor 715 may include a respective channel region (e.g., channel region 725-*a*, 725-*b*, and 725-*c*).

As described herein, during an access operation, each digit line common to a plate may be selected. In the example shown in FIG. 7A, each of digit lines 705-*a*, 705-*b*, and 705-*c* may be selected during an access operation. To perform an access operation on one or more memory cells associated with selected digit lines of the memory array, a corresponding word line may be selected. In some examples, a word line may be coupled with a gate of each transistor 715 (e.g., transistor 715-*a*, transistor 715-*b*, and transistor 715-*c*). Accordingly, by selecting a word line (e.g., by applying a voltage to a gate of a particular transistor), a memory cell at the intersection of the selected digit line and the selected word line may be accessed. In some examples, multiple (e.g., each) memory cell associated with a common plate may be accessed simultaneously during an access operation.

In some examples, a shield line may be located between (e.g., adjacent to) each digit line in a memory array. For example, shield line 710-*a* may be located between digit line 705-*a* and digit line 705-*b*. Additionally or alternatively, shield line 710-*b* may be located between digit line 705-*b* and digit line 705-*c*. By placing a shield line between each digit line of a plate, each digit line of the plate may be concurrently selected with reduced crosstalk or other disturbances. For example, each shield line may be grounded, and the voltages (e.g., the signals) across each digit line may be shielded from each other. Accordingly, each digit line may be simultaneously selected without electrical disturbance affecting data read from or written to a memory cell.

In some examples, each shield line 710 may be or may be referred to as a conductive line or a metal line. As described with reference to FIG. 6, each shield line 710 may be connected to a zero-voltage source or other voltage sink (e.g., each line may be grounded). The shield lines 710 may extend in a same plane as the digit lines 705—i.e., each shield line may run parallel to each digit line such that an entire length of each digit line is shielded from an adjacent (e.g., an immediately neighboring) digit line. In other examples, one or more shield lines 710 may be located between a portion of adjacent digit lines 705. Regardless, the shield lines 710 may serve to electrically isolate signals being transmitted along any digit lines 705 that are common to a plate.

Figure 7B:
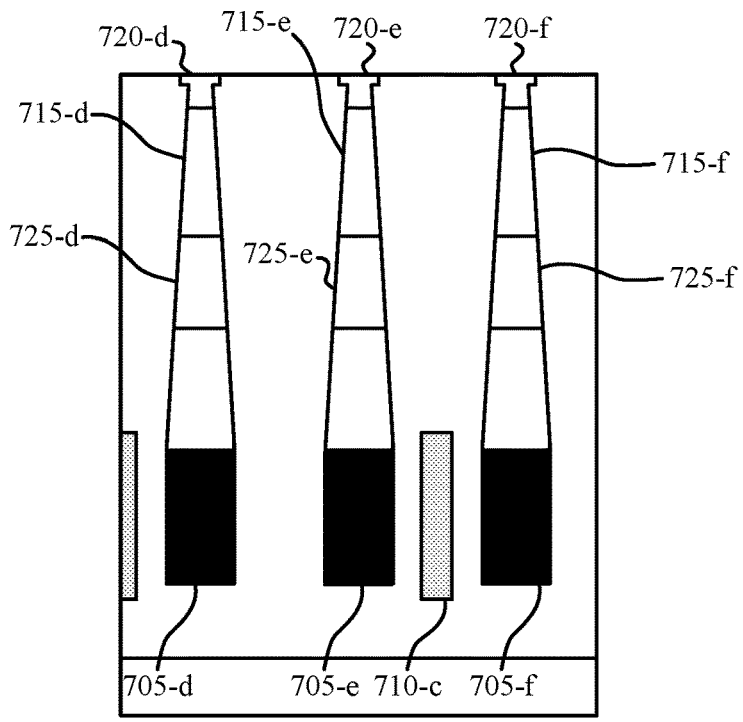

FIG. 7B illustrates an example of a memory array 700-*b* that supports digit line management for a memory array in accordance with examples as disclosed herein. In some examples, the memory array 700-*b* may illustrate the location of one or more shield lines (e.g., shield line 710-*c*) that are configured to isolate one or more digit lines (e.g., isolate digit line 705-*e* from digit line 705-*f*), which may be concurrently selected. Accordingly, the memory array 700-*b* may include digit lines 705-*e* and 705-*f* that are each coupled with a memory cell (e.g., with a transistor that is included in a memory cell, such as a transistor that comprises a selection device for the memory cell). For example, the digit line 705-*e* may be coupled with a transistor 715-*e* (e.g., a source of the transistor 715-*e*) and the digit line 705-*f* may be coupled with a transistor 715-*f* (e.g., a source of the transistor 715-*b*). In some examples, each transistor (e.g., a drain of each transistor) may be coupled with a respective capacitor (e.g., capacitor 720-*d* through 720-*f*), which may be a storage element within a memory cell that includes the transistor, such as a ferroelectric capacitor. In some examples, each transistor 715 may include a respective channel region (e.g., channel region 725-*d*, 725-*e*, and 725-*f*).

As described herein, during an access operation, each digit line common to a plate may be selected. In the example shown in FIG. 7B, at least digit lines 705-*e* and 705-*f* may be selected during an access operation. To perform an access operation on one or more memory cells associated with a selected digit line, a corresponding word line may be selected. In some examples, a word line may be coupled with a gate of each transistor 715 (e.g., transistor 715-*d*, transistor 715-*e*, and transistor 715-*f*). Accordingly, by selecting a word line (e.g., by applying a voltage to a gate of a particular transistor), a memory cell at the intersection of the selected digit line and the selected word line may be accessed.

In some examples, a shield line may be located between (e.g., adjacent to) a subset of digit lines in a memory array. For example, shield line 710-*c* may be located between digit line 705-*e* and digit line 705-*f*. As a matter of design choice, a shield line may be located between some (but not all) digit lines that are common to a plate. This may allow for each digit line of the plate to be selected concurrently, but may allow for only particular memory cells to be accessed with decreased risk of electrical disturbance. For example, due to the shield line 710-*c* being located between digit line 705-*e* and digit line 705-*f*, a memory cell located at the intersection of the digit line 705-*f* and a relevant word line (e.g., coupled with the gate of the transistor) may be accessed, and thus, in some examples, only digit lines 705 with at least one shield line 710 between them may be selected (e.g., every other digit line 705 may be selected). For example, due to the presence of the shield line 710-*c*, data being transmitted along the digit line 705-*f* may be unaffected by the voltage across digit line 705-*e* (e.g., due to the digit line 705-*e* being selected). In some examples, the shield line 710-*c* may be grounded, and the voltages (e.g., the signals) across digit line 705-*e* and digit line 705-*f* may be shielded from each other.

In some examples, each shield line 710 may be or may be referred to as a conductive line or a metal line and may be located between any combination of digit lines 705. For example, any two digit lines 705 in a memory array may be separated by a shield line 710. As described with reference to FIG. 6, each shield line 710 may be connected to a zero-voltage source or other voltage sink (e.g., each line may be grounded). The shield lines 710 may extend in a same plane as the digit lines 705—i.e., each shield line may run parallel to each digit line such that an entire length of each digit line is shielded from an adjacent (e.g., an immediately neighboring) digit line. In other examples, one or more shield lines 710 may be located between a portion of adjacent digit lines 705. Regardless, the shield lines 710 may serve to electrically isolate signals being transmitted along any digit lines 705 that are common to a plate.

Figure 8:
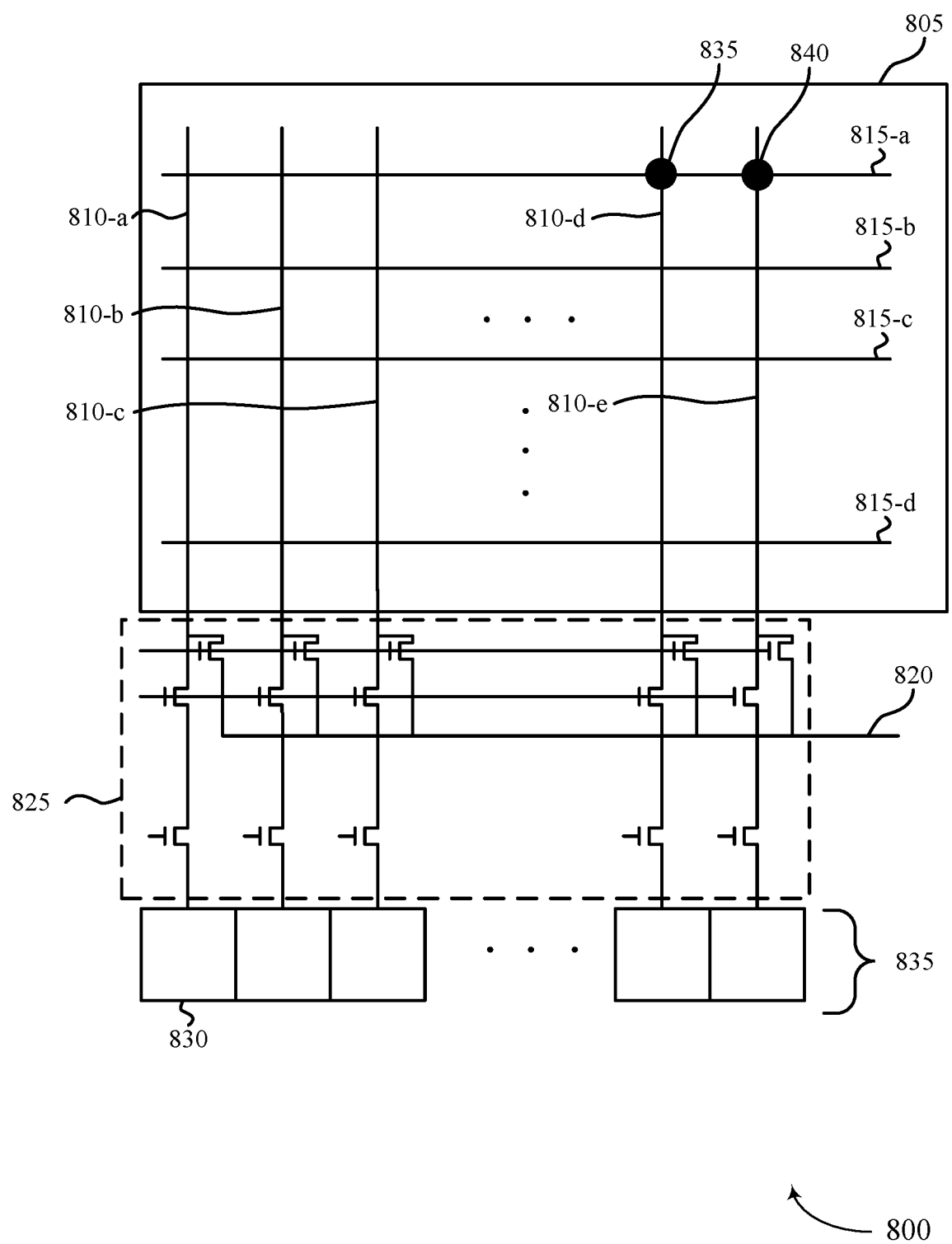
FIG. 8 illustrates an example of a memory array that includes a selected plate that supports digit line management for a memory array in accordance with examples as disclosed herein.

FIG. 8 illustrates an example of a memory array 800 that includes a selected plate that supports digit line management for a memory array in accordance with examples as disclosed herein. In some examples, the memory array 800 may include a plate 805 (e.g., a selected plate), which may be an example of a plate 520 as described with reference to FIG. 5. That is, the plate 805 may be or may represent one of a plurality of plates that are associated with a single unit (e.g., a single plate group). In some examples, the unit may be one of a plurality of units of a single patch (e.g., patch 505 as described with reference to FIG. 5). In some examples the plate 805 may correspond to a plurality of digit lines 810 (e.g., digit lines 810-*a* through 810-*e*) and a plurality of word lines (e.g., word lines 815-*a* through 815-*d*). In other examples, the memory array 800 may include one or more shield lines (not shown) as described with reference to FIGS. 6 and 7. In some examples, each digit line 810 may be coupled with a multiplexing component 825 that corresponds to the unit and is thus couplable with a respective sense amplifier 830 within a set of sense amplifiers 835 that corresponds to the unit. The multiplexing component 825 may be an examples of a multiplexing component 525, and the set of sense amplifiers 835 may be an example of a set of sense amplifiers 530 as described with reference to FIG. 5. Each sense amplifier 830 may be configured to sense one memory cell when a digit line associated with the plate 805 is selected and coupled with the sense amplifier 830.

As described herein, a plate (e.g., plate 805) common to a plurality of memory cells may be selected, and each digit line associated with the plate may be selected concurrently. For example, plate 805 may be selected (e.g., by applying a voltage via plate line 820), which may result in a voltage across the plate 805 increasing. In some examples, each (all) of the digit lines corresponding to the plate 805 (e.g., digit line 810-*a* through 810-*e*) may be selected. Each of the digit lines may be selected at a same time (e.g., concurrently, simultaneously, for a same duration). In order to access a memory cell (or a set of memory cells) associated with the plate 805, a relevant word line may be activated. For example, a first memory cell 835 (e.g., a first ferroelectric memory cell) may be located at the intersection of the word line 815-*a* and the digit line 810-*d* (e.g., the first digit line), and a second memory cell 840 (e.g., a second ferroelectric memory cell) may be located at the intersection of the word line 815-*a* and the digit line 810-*e* (e.g., the second digit line).

Because every digit line associated with the plate 805 may be selected during an access operation, the first memory cell 835 and the second memory cell 840 may be accessed concurrently by selecting the word line 815-*a*. Thus, in some examples, an access operation may be performed on the first ferroelectric memory cell while the second digit line is selected. Stated another way, data may be written to or read from the first ferroelectric memory cell 835 while the digit line associated with the second ferroelectric memory cell 840 is selected (e.g., while the digit line is activated). In some examples, other memory cells associated with the memory array 800 may also be accessed at a same time that the first memory cell 835 and the second memory cell 840 are being accessed. For example, memory cells located at an intersection of a respective digit line and the word line 815-a may be accessed at a same time that the first memory cell 835 and the second memory cell 840 are being accessed (e.g., due to every digit line of the plate 805 being selected)

As described herein, unintended electrical disturbance (e.g., cross-coupling) may be a risk when adjacent access lines are selected. However, in some examples, each of the sense amplifiers 830 may be configured to sense one or more memory cells in a manner that supports concurrently selecting multiple adjacent digit lines with reduced risk of such disturbance. For example, the sense amplifiers 830, which each may be or may be referred to as high-gain sense amplifiers 830, may be configured to support the use of lower voltage swing signals on the digit lines 810, and also may be configured (e.g., via one or more related capacitors) to avoid signal saturation (e.g., for strong memory cells). Stated another way, the sense amplifiers 830 may be configured to sense a memory cell (e.g., the first memory cell 835) when one or more digit lines that are adjacent to the memory cell are selected (e.g., when digit line 810-e is selected) with reduced risk of unintended electrical disturbance. Accordingly, during an access operation of the first memory cell 835, the configuration of the sense amplifiers 830 (as described with reference to FIGS. 9 and 10) may prevent any unintended data corruption due to multiple digit lines being selected concurrently.

In some examples, the plate 805 may be coupled with a multiplexing component 825 that is coupled with a respective plurality (set) of sense amplifiers 835. The respective plurality (set) of sense amplifiers 835 may include a plurality of sense amplifiers 830, which thus may be coupled with the multiplexing component 825. Accordingly, the multiplexing component 825 may couple each activated digit line with a respective sense amplifier 830 within the respective plurality (set) of sense amplifiers 835. Thus, in some examples, memory cells respectively associated with each of the selected digit lines (e.g., digit line 810-a through digit line 810-e) may be accessed concurrently.

As shown in FIG. 8, a plate 805 may correspond to any number of digit lines. For example, a plate 805 may correspond to eight (8) digit lines that are each configured to be selected concurrently (e.g., at a same time). However, in other examples, a plate may correspond to any number of digit lines. Additionally or alternatively, a plate may correspond any number of multiplexing components and/or sense amplifiers that allow memory cells associated with the selected digit lines to each be concurrently (e.g., simultaneously) sensed.

Figure 9:
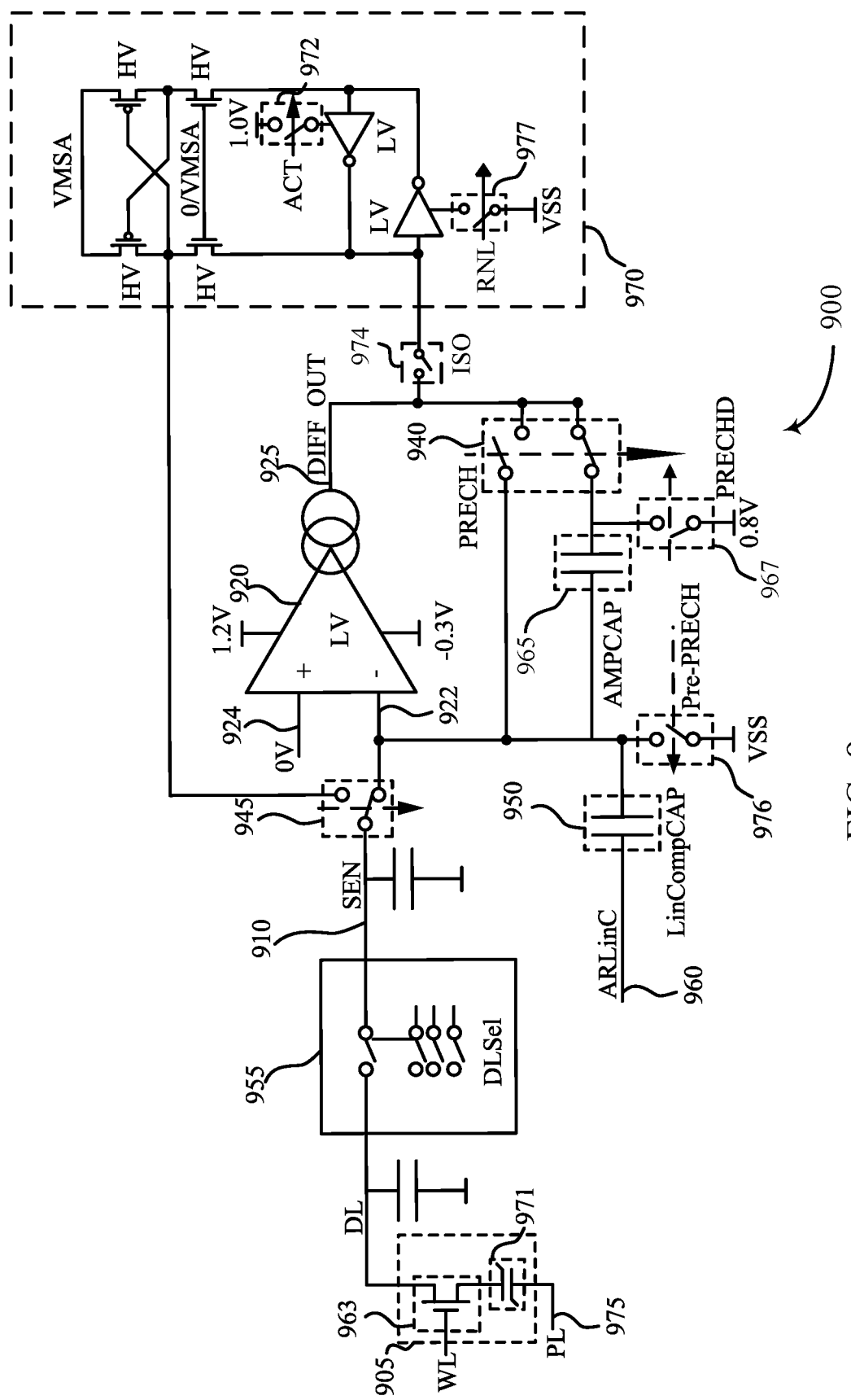
FIG. 9 illustrates an example of a sense amplifier that supports digit line management for a memory array in accordance with examples as disclosed herein.

FIG. 9 illustrates an example of a circuit 900 that supports digit line management for a memory array in accordance with examples as disclosed herein. In some examples, the circuit 900 may include one or more components described above with reference to FIGS. 4 through 8. For example, circuit 900 may include a memory cell 905, a signal line 910, and a sense amplifier 920. The sense amplifier 920 may include an output 925 (e.g., an output node 925), a first input 922 (e.g., a first input node 922), and a second input 924 (e.g., a second input node). The first input 922 may be coupled to the switch 945, and the second input 924 may be coupled to a voltage source (e.g., a voltage reference, a target voltage, a digit line precharge voltage). Circuit 900 may include a first capacitor 950 (which may be referred to as a linear compensation capacitor, or LinCompCAP), a second capacitor 965 (which may be referred to as an amplifier capacitor, or AMPCAP), a switch 940, a switch 945, a switch 955, a switch 967, a switch 974, a switch 976, a switch 977, and a latch 970. The latch may include a switch 972. In some examples, the memory cell 905 may include a transistor (e.g., a switching component) 963 and a capacitor 971 (e.g., a storage component, which may be a ferroelectric capacitor). The memory cell 905 may be coupled with a digit line, a word line, and a plate line 975. Each of the switches 940, 945, 955, 967, 972, 974, 976, and 977 may comprise, for example, one or more transistors.

In some examples, memory cell 905 may be indirectly coupled with the sense amplifier 920. For example, memory cell 905 may be coupled (e.g., selectively coupled and decoupled) with the signal line 910 via the switch 955, which in turn, may be coupled (e.g., selectively coupled and decoupled) with the sense amplifier 920 via the switch 945.

The switch 945 may be in a first position or a second position. The first position of switch 945 may place the circuit 900 in a sensing mode and the second position of switch 945 may place the circuit 900 in a write-back mode. In write-back mode, the switch 945 may couple the memory cell 905 with latch 970.

Additionally, the memory cell 905 may be coupled with switch 955 which may select a digit line and couple the selected digit line with the signal line 910. In one example, the switch 955 may be configured to concurrently select multiple digit lines (not shown), and concurrently couple each of the multiple digit lines with a respective one of multiple sense amplifiers (not shown) to thereby concurrently sense multiple memory cells, one of which is memory cell 905. The switch 955 may be in a first position or a second position. The first position of the switch 955 may decouple the memory cell 905 from the signal line 910, and the second position may couple the memory cell 905 with the signal line 910 (and thus with the sense amplifier 920 when the switch 945 is also in the first position).

In some examples, the switch 940 may be a double-throw switch and may be activated based on the application of a control signal (e.g., PRECH). In some examples, the switch 940 may comprise multiple single-throw switches, which may be operated together to serve the functions ascribed herein to the switch 940. When the switch 940 is in a first position, the switch 940 may decouple the sense amplifier output 925 from the first input 922 and may couple the sense amplifier output 925 with a plate of the second capacitor 965 and with a switch 967. When the switch 940 is in the second position, the switch may couple the sense amplifier output 925 with the sense amplifier first input 922 to create a feedback loop and may decouple the sense amplifier output 925 from the plate of the second capacitor 965 and switch 967.

In some examples, the switch 967 may be coupled with a voltage source (e.g., 0.8V) and may be configured to be activated based on a control signal (e.g., PRECHD). In one example, the switch 967 may be configured to apply a voltage from the voltage source to the second capacitor 965 (and the sense amplifier output 925, depending on the position of the switch 940) based on the control signal being applied to the switch 967 (e.g., based on the control signal going "high"). The first position of the switch 967 may decouple the second capacitor 965 from the voltage source, and the second position may couple the second capacitor 965 with the voltage source.

In some examples, the switch 972 may be configured to selectively couple or decouple the latch 970 from a power supply (e.g., a 1.0V power supply). In some examples, the switch 977 may be configured to selectively couple or decouple the latch 970 to a second power supply or voltage reference (e.g., VSS) based on a control signal. When the switches 972 and 977 are both closed, the latch 970 may be activated, and the latch 970 may be deactivated when either of the switches 972 and 977 are open. Activating the latch 970 may be referred to in some cases as firing the latch 970, or alternatively as firing the sense amplifier 920.

In some examples, the switch 974 may be configured to selectively couple or decouple the sense amplifier output 925 from the latch 970 based on a control signal (e.g., ISO).

In some examples, the switch 976 may be coupled with a voltage source (e.g., VSS, which may be a negative supply voltage or a ground reference) and with the first input 922, and may be configured to be activated based on a control signal (e.g., Pre-PRECH). In one example, the switch 976 may be configured to apply a voltage from the voltage source to the input node 922, and thus to a terminal of the first capacitor 950 and/or the second capacitor 965, based on the control signal being applied to the switch 976 (e.g., based on the control signal going "high"). The first position of the switch 976 may decouple the first capacitor 950 and the second capacitor 965 from the voltage source and the second position may couple the first capacitor 950 and the second capacitor 965 with the voltage source.

In the example of FIG. 9, the sense amplifier 920 may be a differential amplifier. In one example, the sense amplifiers described with reference to FIGS. 4 through 10 may be differential amplifiers. In some examples, the digit line may be precharged by the sense amplifier 920 to a voltage which may be or otherwise reflect an offset voltage (e.g., an inherent or native voltage that is associated with the sense amplifier 920, and which may be an undesired or unpredictable voltage). For example, the target or desired precharge voltage may be the voltage at which the second input 924 of the sense amplifier 920 is biased, but the sense amplifier 920 may have an inherent offset of some voltage, and thus the first voltage to which the signal line 910 is precharged may be the target precharge voltage plus/minus the offset voltage. In some examples, the target precharge voltage may be zero (e.g., 0V) and thus the first voltage may equal the offset voltage of the sense amplifier 920 (e.g., 0.05V). In other examples, however, the target precharge voltage may be some other voltage (e.g., 1.5V), and thus first voltage may equal the target precharge voltage plus/minus the offset voltage (e.g., 1.55V), which may not equal the offset voltage of the sense amplifier 920.

When configured in an open loop, the sense amplifier 920 may behave similarly to a comparator. The sense amplifier 920 may drive the output 925 high when the voltage at the first input 922 is lower than the voltage of the second input 924. In some cases, the output of the sense amplifier 920 may have a "digital" characteristic, such that the voltage may be a high-level or a low-level and may be used to directly interface logic gates of devices (e.g., logic gates included in the latch 970).

The voltage on the second input 924 may be a target voltage, which in some cases may be approximately zero. In some examples, the second input node 924 may be biased to the precharge voltage (e.g., the target voltage of the signal line 910 when precharged). In some examples, the first voltage may be based on a gain of the sense amplifier 920. Additionally, the sense amplifier 920 that contributes to the precharging of the signal line 910 may also be the sense amplifier 920 that senses the states of the memory cell.

In one example, the charge sharing between the memory cell 905 and the signal line 910, and the charge sharing between the signal line 910 and the capacitors 950, 965 may occur during at least partially overlapping time periods. In another example, the charge sharing between the memory cell 905 and the signal line 910 may take place prior to the charge sharing between the signal line 910 and the capacitors 950, 965.

In some examples, the sense amplifier first input 922 may be coupled with a first capacitor 950 (e.g., LinCompCAP). The sense amplifier first input 922 may be coupled with a second capacitor 965 (e.g., AMPCAP). In some examples, the first capacitor 950 may be coupled with a control line 960 (e.g., ARLinC) and with the first input 922. The second capacitor 965 may be coupled with the switch 967 and the switch 940 and with the first input 922. Thus, the first capacitor 950 may be coupled with the second capacitor 965, as both may be coupled with the sense amplifier first input 922.

In some examples, the first capacitor 950 and the second capacitor 965 may be configured to charge share with the memory cell 905 (e.g., via the digit line and the signal line 910). In some examples, the memory cell 905 and the first capacitor 950 may charge share with the second capacitor 965. In some examples, the first capacitor 950 and the second capacitor 965 may charge share (or finish charge sharing) before the memory cell 905 and the first capacitor 950 charge share (or finish charge sharing). In some examples, the ferroelectric properties (e.g., polarization properties) of the memory cell 905 and/or a resistance and capacitance (RC impedance) of the digit line and signal line 910 (e.g., due to physical distance between the memory cell 905 and the second capacitor 965) may result in charge sharing between the memory cell 905 and the second capacitor 965 being slow relative to charge sharing between the first capacitor 950 and the second capacitor 965 (e.g., the first capacitor 950 may be a linear capacitor, such as a CMOS-based capacitor, and may be physically closer to the second capacitor 965 relative to the memory cell 905). Thus the properties of the memory cell 905 and/or the digit line may result in charge sharing between the first capacitor 950 and the second capacitor 965 happening more quickly (and thus ceasing earlier) than charge sharing between the ferroelectric memory cell 905 and the second capacitor 965. In some cases, charge sharing between the first capacitor 950 and the second capacitor 965 may include charge being transferred from the second capacitor 965 to the first capacitor 950, and charge sharing between the memory cell 905 and the second capacitor 965 may include charge being transferred from the memory cell 905 to the second capacitor 965. The first capacitor 950 and/or the second capacitor 965 may be configured (e.g., sized) to maintain the sense amplifier 920 in a linear operating range during a sensing operation as described herein (e.g., while sensing the memory cell 905). That is, the first capacitor 950 and/or the second capacitor 965 may be configured (e.g., sized) to maintain the voltage at the first input 922 within a range that avoids saturating the sense amplifier 920.

In some examples, the latch 970 may vary depending on the desired characteristics of circuit 900. For example, various implementations of the latch 970 may be configured to operate at different voltage levels or in view of various performance tradeoffs such as component count or complexity, footprint, operating speed, etc. The latch 970 may thus be configured to accommodate but may not significantly affect some of the functions as discussed with respect to other aspect of circuit 900. For example, the latch 970 may not affect the functionality of the digit line and signal line 910 being precharged by the sense amplifier 920, and also may not affect the charge sharing functions between the signal line 910 and the memory cell 905, or the charge sharing between the capacitors (e.g., first capacitor 950 and/or second capacitor 965) and the memory cell 905. Further, any appropriate logic combination which implements similar functionality may be used, such as but not limited to flip-flop components or set reset latches. In some instances, the latch 970 may be utilized in various circumstances. For example, the latch 970 may be configured to be used with components having relatively low voltage tolerances.

As discussed herein, utilizing such a sensing scheme may allow for multiple digit lines (e.g., each digit line common to a same plate) to be selected concurrently. Accordingly, the sensing operation described herein with reference to FIG. 9 may occur concurrently across multiple digit lines common to a same plate (e.g., using multiple sense amplifiers as described with reference to FIGS. 5, 6, and 8). Further, utilizing a sense amplifier as described herein (e.g., a high-gain sense amplifier), voltages across adjacent digit lines may be more-easily discerned, resulting in greater reliability during an access operation.

Figure 10:
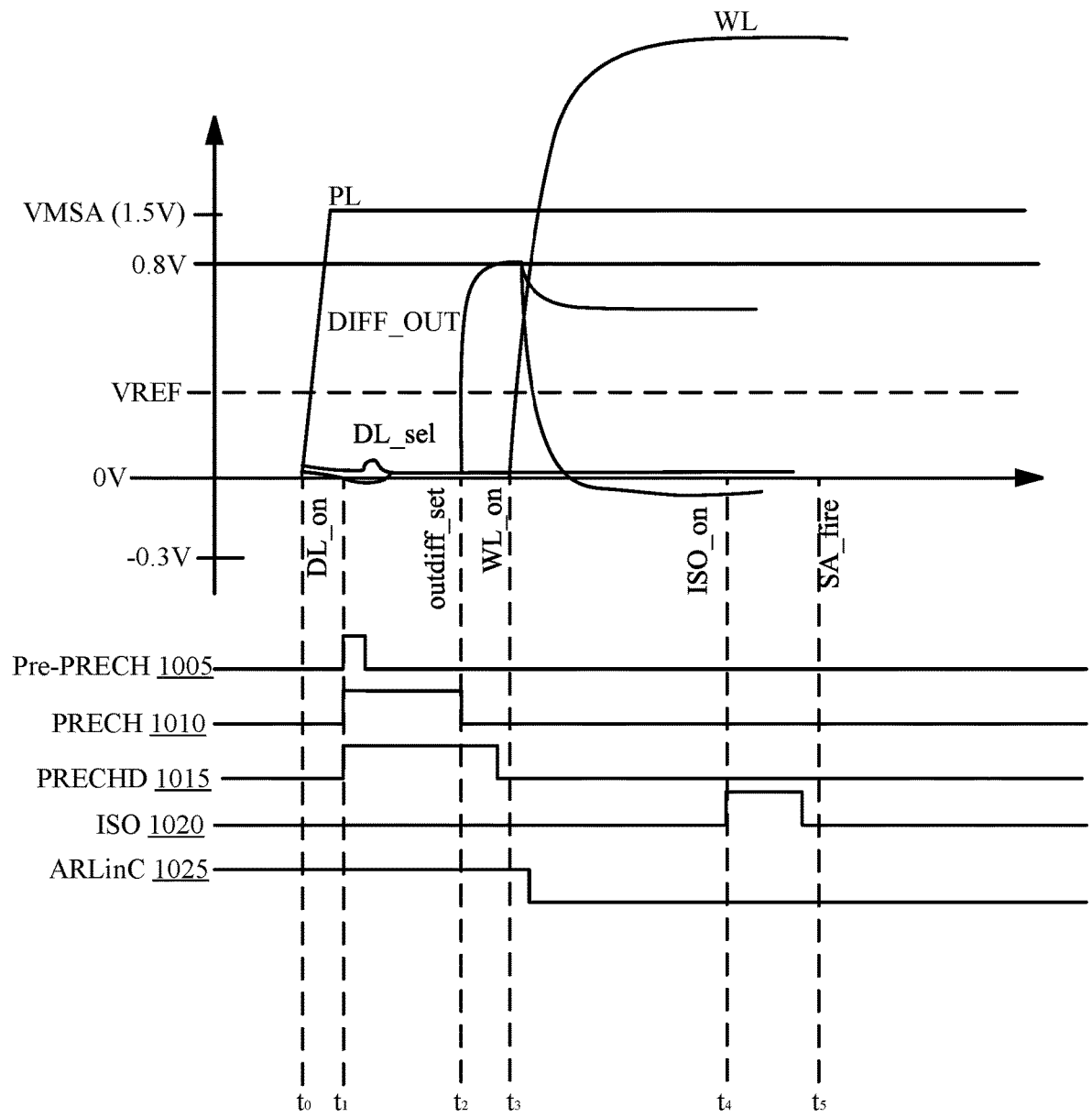
FIG. 10 illustrates an example of a timing diagram for operating a sense amplifier that supports digit line management for a memory array in accordance with examples as disclosed herein.

FIG. 10 illustrates an example of a timing diagram 1000 that supports digit line management for a memory array in accordance with examples as disclosed herein. In some examples, timing diagram 1000 may correspond to the operation of circuit 900 as illustrated in FIG. 9.

Before to, the circuit 900 may be in an initial configuration. The switch 955 may be configured to decouple (isolate) the digit line from the signal line 910. In some cases, the switch 945 may be configured to couple the first input node 922 with the signal line 910. In other cases, the switch 945 may be configured to decouple (isolate) the first input node 922 from the signal line 910. The Pre-PRECH signal 1005 may be low, and thus the switch 976 may be open or otherwise configured to decouple (isolate) the first input node 922 from VSS. Thus, the LinCompCAP 950 and the AMPCAP 965 may be decoupled from a voltage source (e.g., decoupled from VSS). The PRECH signal 1010, may be low, and thus the switch 940 may be configured to decouple (isolate) the output 925 from the first input node 922 and to couple the output 925 with a node of the AMPCAP 965 and switch 967. The PRECHD signal 1015 may be low, and thus the switch 967 may be configured to decouple (isolate) the AMPCAP 965 and switch 940 from the voltage source with which the switch 967 is coupled. (e.g., 0.8V). The ISO signal 1020 may be low, and thus the switch 974 may be configured to decouple (isolate) the output 925 from the latch 970. The ARLinC signal 1025 may be high, and thus a voltage (e.g., a positive voltage) may be applied to one node of the LinCompCAP 950.

At $t_0$, the plate line 975 may be selected, and as shown by the PL waveform in FIG. 10, the voltage of the plate line 975 may be increased to a selected plate line voltage (e.g., 1.5V), which may be referred to as a VMSA voltage.

At $t_1$, which may be concurrent with or after the voltage of the plate line 975 reaches the VMSA voltage, the digit line may be selected. In some cases, selecting the digit line may include coupling the digit line with the first input 922 of the sense amplifier 920. This may include configuring the switch 955 to couple the digit line with the signal line 910. If the signal line 910 is not already coupled with the first input node 922, selecting the digit line may further include configuring the switch 945 to couple the signal line 910 with the first input node 922.

In some examples, at $t_1$, the Pre-PRECH signal 1005, the PRECH signal 1010, and the PRECHD signal 1015 may transition from each being in a low state to each being in a high state. The ARLinC signal 1025 may remain high, and the ISO signal 1020 may remain low. When the Pre-PRECH signal 1005 is high, the switch 976 may be activated (e.g., it may move to a second position). For example, when the switch 976 is in the second position, the first input node 922 (and thus one node of the LinCompCAP 950 and one node of the AMPCAP 965) may be coupled with VSS, which may initialize the first input node 922 to VSS (e.g., may ground the first input node 922). When coupled with VSS, the signal being applied via the signal line 960 (ARLinC signal 1025) may allow for a charge to be placed on the LinCompCAP 950 (e.g., may charge the LinCompCAP 950 to the high-state voltage of ARLinC, if VSS is ground). Accordingly, the amount of charge stored on and shared by the first capacitor 950 may be based on a voltage of the signal applied via the control line 960.

In some examples, the Pre-PRECH signal 1005 may remain high for only a portion of the time between $t_1$ and $t_2$ (e.g., the Pre-PRECH signal 1005 may go "low" before $t_2$). The PRECH signal 1010 and the PRECHD signal 1015 may remain high after the Pre-PRECH signal 1005 goes low.

In some examples, when the PRECH signal 1010 is high, the switch 940 may be in a second position. As described herein, the switch 940 may comprise a double-throw switch or multiple single-throw switches. As described herein, when the switch 940 is in the second position, the switch 940 may couple the output 925 of the sense amplifier 920 to the first input 922 of the sense amplifier 920, which may cause the sense amplifier 920 to precharge the digit line (and thus also the signal line 910 coupled therewith) to a first voltage or an initial sensing voltage, which may be based on (e.g., equal to) the voltage applied to the second input 924 of the sense amplifier, plus or minus any offset voltage that may be inherent to the sense amplifier 920. In some examples, switching the switch 940 to the second position may create a feedback loop. As discussed herein, the feedback loop may be created by coupling the output 925 of the sense amplifier with the first input 922 of the sense amplifier. The DL_sel waveform in FIG. 10 illustrates the digit line voltage in an example case in which the sense amplifier 920 has slight positive offset, and thus DL_sel approaches but does not fully reach the target precharge voltage of 0V to which the second input 924 is biased.

In some examples, when the PRECHD signal 1015 is high, the switch 967 may be in a second position. When the switch 967 is in the second position, the AMPCAP 965 may be coupled with a voltage source (e.g., coupled with 0.8V). In some examples, coupling the AMPCAP 965 with the voltage source may allow for a charge to be placed on the AMPCAP 965 (e.g., may charge the AMPCAP 965 to the voltage differential between the voltage source and VSS (e.g., 0.8V in the example of FIG. 9, if VSS is ground)). Accordingly, the amount of charge stored on and shared by the capacitor 965 may be based on a voltage applied via the switch 967.

At $t_2$, the PRECH signal 1010 may transition from the high state to the low state (e.g., the PRECH signal 1010 may go "low" at $t_2$). In some examples, when the PRECH signal 1010 goes low (e.g., reverts to low), the switch 940 may switch to the first position, and the sense amplifier feedback loop may be disabled due to the sense amplifier output 925 being decoupled (isolated) from the first input 922 of the sense amplifier. Disabling the feedback loop may end (cease) the precharging of the digit line to the target voltage.

Also, when the PRECH signal 1010 goes low (e.g., reverts to low), the output 925 of the sense amplifier 920 may be coupled with the voltage source (e.g., 0.8V in FIG. 9) via the switch 940 and the switch 967, as the control signal PRECHD 1015 may remain high. This may "set" or initialize the output 925 to the voltage of the voltage source (e.g., 0.8V), as shown by the DIFF_OUT waveform in FIG. 10 rising to 0.8V beginning at $t_2$. When the PRECH signal 1010 goes low, the output 925 of the sense amplifier 920 may also be coupled with the AMPCAP 965—that is, the AMPCAP 965 may be coupled with both the output 925 and the first input 922 of the sense amplifier 920.

In some examples, the PRECHD signal 1015 may remain high during an entirety of the period between $t_1$ and $t_2$ (e.g., the PRECHD signal 1015 may remain "high" until after $t_2$). Thus, the PRECHD signal 1015 may remain high after the PRECH signal 1010 and the Pre-PRECH signal 1005 have gone low. In some examples, after they transition from high to low, the Pre-PRECH signal 1005 and the PRECH signal 1010 may remain low for the remainder of the access operation described herein.

In some examples, the PRECHD signal 1015 may go low before $t_3$. When the PRECHD signal 1015 goes low, switch 967 may revert to the first position, and thus the second capacitor 965 and the output 925 may be decoupled from the voltage source (e.g., decoupled from 0.8V). At this time, the input node 922 may be floating, as the first input 922 of the sense amplifier 920 may have a high (theoretically infinite) input impedance, the transistor 963 may isolate the digit line from the memory cell 905, the switch 976 may isolate the first input node 922 from VSS, and the AMPCAP 965 and LinCompCAP 950 may appear as open circuits to the first input node 922.

At $t_3$, which may be after the PRECHD signal 1015 goes low the word line may be selected (activated), which—once the word line reaches the threshold voltage of the transistor 963—may cause the transistor 963 to couple the digit line with the memory cell 905, so that the memory cell 905 may charge share with one or more of the digit line (e.g., the digit line capacitance, which may be parasitic), the signal line 910 (e.g., the signal line 910 capacitance, which may be parasitic), the LinCompCAP 950, and the AMPCAP 965. In some examples, a relevant word line being enabled may be indicated by a voltage of the word line (e.g., a voltage of WL) increasing, as shown by the WL waveform in FIG. 10.

In some examples, charge sharing between the AMPCAP 965 and the LinCompCAP 950 (e.g., charge transfer from the AMPCAP 965 to the LinCompCAP 950) may occur or be complete before charge sharing between the memory cell 905 and the AMPCAP 965 (e.g., charge transfer from the memory cell 905 to the AMPCAP 965) occurs or is complete. For example, the ferroelectric properties of the memory cell 905, a resistance and capacitance (RC impedance) of the digit line, and the properties of the transistor 963 may delay charge being shared between the memory cell 905 and the AMPCAP 965. The LinCompCAP 950 may, however, be a linear capacitor (with a linear dielectric), such as a CMOS capacitor, and may be physically close to the AMPCAP 965 (e.g., both the LinCompCAP 950 and the AMPCAP 965 may be within a same sense amplifier circuit), and thus charge sharing between the LinCompCAP 950 and AMPCAP 965 may occur more quickly (at a faster rate) than charge sharing between the memory cell 905 and the AMPCAP 965.

For example, when the word line is selected at $t_3$, the memory cell 905 may not be coupled (or fully coupled) with the first input node 922 (and thus with the LinCompCAP 950 and the AMPCAP 965) until the voltage of the word line increases to the threshold voltage of the transistor 963, which may have a resistance that decreases over time beginning at $t_3$.

In some examples, at some time between $t_3$ and $t_4$ (e.g., shortly after $t_3$, at a time concurrent with or before the voltage of the word line reaches the threshold voltage of the transistor 963), the ARLinC signal 1025 may go low (e.g., transition from a high state to a low state). In some cases, when the ARLinC signal 1025 goes from high to low, this may cause the LinCompCap 950 to begin charge sharing with (e.g., extracting charge from) the AMPCAP 965, which may occur quickly relative to the charge sharing between the memory cell 905 and the AMPCAP 965 after $t_3$ for the reasons explained herein (e.g., closer proximity of the LinCompCap 950, ferroelectric properties of the memory cell 905). Charge sharing between the memory cell 905 and the AMPCAP 965 (e.g., charge transfer from the memory cell to the AMPCAP 965) thus may continue after the ARLinC signal 1025 goes low and after charge sharing between the LinCompCAP 950 and the AMPCAP 965 is complete. In some examples, after transitioning low, the ARLinC signal 1025 may remain low for the remainder of the access operation described herein. In some examples, the AMPCAP 965 may integrate (e.g., store) a charge shared with (exchanged between) memory cell 905 and the LinCompCAP 950 after $t_3$.

The LinCompCAP 950 and the AMPCAP 965 may be configured (sized) to maintain the sense amplifier 920 in a linear (non-saturated) operating mode (region) while charge is being shared between one or more of the capacitors 950, 965 and the memory cell 905. For example, one or both of the first capacitor 950 and the second capacitor 965 may be larger (of increased capacitance) compared to some implementations.

Between $t_3$ and $t_4$, as charge sharing occurs between the memory cell 905 and one or more other aspects of the circuit 900 as described herein, the voltage of the first input 922 may change depending on the amount of charge stored by the memory cell 905 prior to the sensing operation (that is, depending on a logic state stored by the memory cell 905 prior to the sensing operation), and thus so may the voltage of the output 925. This may be depicted in FIG. 10 as two different possible voltage levels output from the sense amplifier 920 (e.g., two different voltages to which the DIFF_OUT waveform may transition between $t_3$ and $t_4$). Even though FIG. 10 illustrates two voltages being output from the sense amplifier 920, this is for illustrative purposes only, and only one of the two voltages is output depending on the sensed logic state for the memory cell 905. The higher voltage level at the output 925 (DIFF_OUT) may be above a reference voltage (VREF) and may be illustrative of the memory cell state being equivalent to a high or one (1) logic state, while the lower voltage level at the output 925 (DIFF_OUT) below a reference voltage (VREF) and may be illustrative of the memory cell state being equivalent to a low or a zero (0) value, or vice versa. Further, the voltage levels in FIG. 10 are representative examples only, may not be to scale, and are for illustrative purposes only.

As depicted in FIG. 10, the voltage levels output from the sense amplifier 920 may both shift downward during the charge sharing between the capacitors 950, 965 and the memory cell 905. The high voltage level and the low voltage level of output may be pulled downward and may be approximately centered around the sum of the target voltage and the offset voltage that precharged the signal line 910. The two voltage levels being pulled down may be based at least in part on the access line having been previously precharged by the sense amplifier 920 and thus may inherently reflect the offset voltage, which may inherently compensate for (e.g., cancel the effect of) the offset voltage.

At $t_4$, the ISO signal 1020 may be enabled (e.g., the ISO signal 1020 may go "high"). When the ISO signal 1020 goes high, the sense amplifier 920 may be coupled with the latch 970, which may allow the latch 970 to store the state sensed for the memory cell 905 by the sense amplifier 920 (e.g., the latch 970 may store whether DIFF_OUT corresponds to the upper or lower voltage at $t_4$).

After $t_4$ and before $t_5$, the ISO signal 1020 may revert low, which may decouple the sense amplifier 920 from the latch 970.

At $t_5$, the switch 972 may couple the latch 970 to a power supply (e.g., 1.0V) and the switch 977 may couple the latch 970 to a second power supply or voltage reference (e.g., VSS, which may be a negative voltage supply or ground), which may be referred to as firing the latch 970, or alternative as firing the sense amplifier 920.

In some examples, the sensing operation described herein with reference to FIG. 10 may occur concurrently across multiple digit lines common to a same plate (e.g., using multiple sense amplifiers as described with reference to FIGS. 5, 6, and 8). By utilizing a sense amplifier as described herein (e.g., a high-gain sense amplifier), the state of multiple memory cells 905 may be sensed concurrently via adjacent digit lines, with related fluctuations in voltage across the adjacent digit lines minimized (e.g., with the use of low swing signaling on the digit lines), resulting in reduced crosstalk risk and greater reliability during an access operation. Accordingly, multiple memory cells associated with a common plate may be sensed concurrently utilizing the scheme described with reference to FIG. 10.

Figure 11:
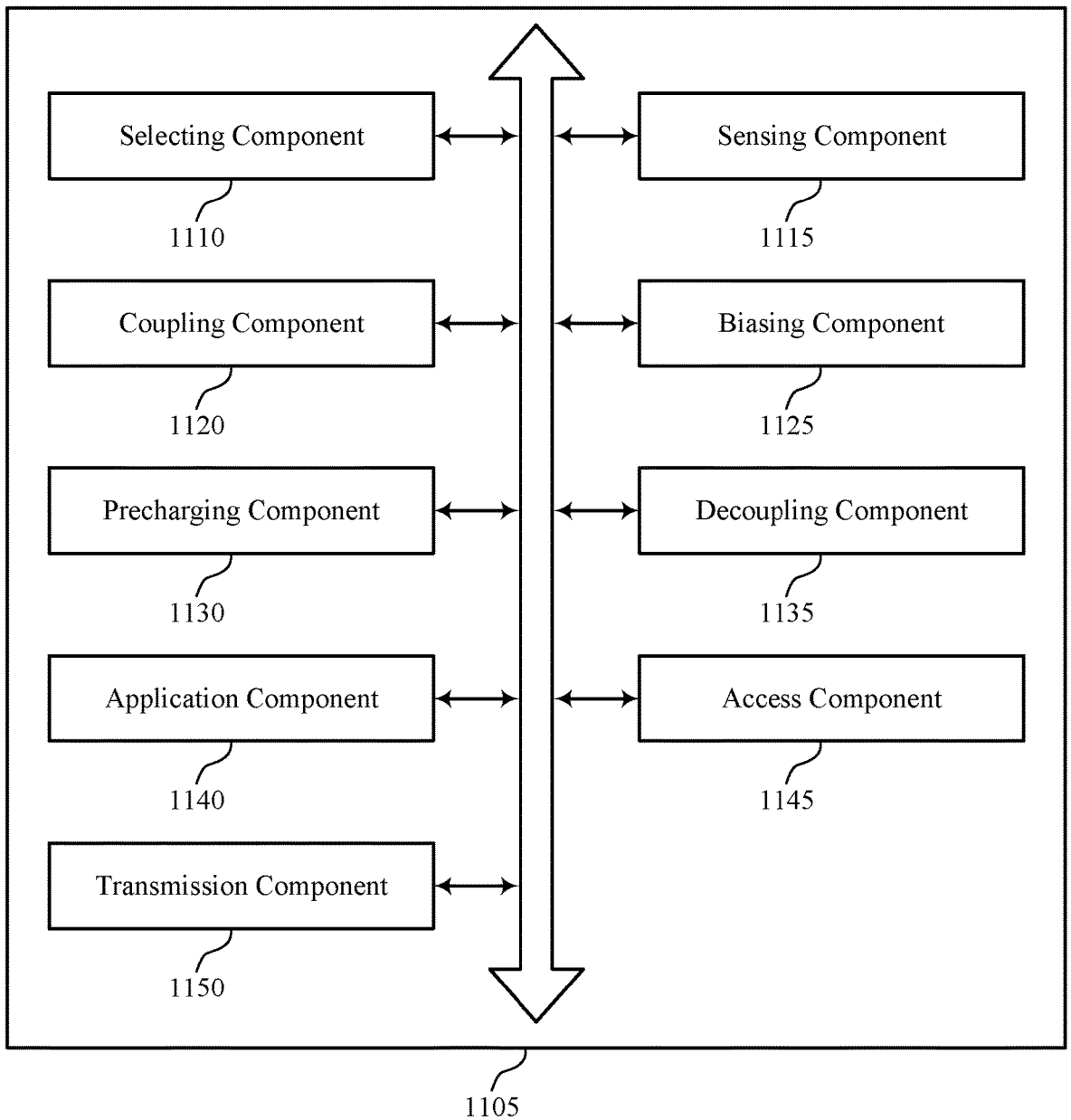
FIG. 11 shows a block diagram of a memory array that supports digit line management for a memory array in accordance with aspects of the present disclosure.

FIG. 11 shows a block diagram 1100 of an array management component 1105 that supports digit line management for a memory array in accordance with examples as disclosed herein. The array management component 1105 may perform one or more aspects of an access operation on a memory array as described with reference to FIGS. 4 through 10. The array management component 1105 may include a selecting component 1110, a sensing component 1115, a coupling component 1120, a biasing component 1125, a precharging component 1130, a decoupling component 1135, an application component 1140, an access component 1145, and a transmission component 1150. Each of these modules may communicate, directly or indirectly, with one another (e.g., via one or more buses).

The selecting component 1110 may select a plate that is common to a set of ferroelectric memory cells, each of the set of ferroelectric memory cells coupled with a respective digit line of a set of digit lines that correspond to the plate. In some examples, the selecting component 1110 may select, based on selecting the plate, the digit lines that correspond to the plate. In some examples, the selecting component 1110 may select, while the digit lines that correspond to the plate are selected, a word line that is coupled with a subset of the set of ferroelectric memory cells.

In some examples, the selecting component 1110 may select a first digit line coupled with a first ferroelectric memory cell and a second digit line coupled with a second ferroelectric memory cell, the first ferroelectric memory cell and the second ferroelectric memory cell coupled with a plate, and where the first digit line is electrically isolated from the second digit line by a shield line. In some examples, the selecting component 1110 may select all the digit lines that correspond to the plate simultaneously. In some examples, the selecting component 1110 may select the first digit line and the second digit line simultaneously, where performing the access operation is based on selecting the first digit line and the second digit line simultaneously. In some examples, the selecting component 1110 may select a digit line of each of the set of ferroelectric memory cells during the access operation.

The sensing component 1115 may sense, based on selecting the word line, a respective charge stored by each ferroelectric memory cell of the subset.

The coupling component 1120 may couple the digit line to a first input node of a sense amplifier. In some examples, the coupling component 1120 may couple the output node of the sense amplifier with a voltage reference. In some examples, the coupling component 1120 may couple a second node of the capacitor with the voltage reference. In some examples, the coupling component 1120 may couple the ferroelectric memory cell with the input node of the sense amplifier based on selecting the word line after precharging the respective digit line, where a portion of the respective charge is transferred between the ferroelectric memory cell and the capacitor based on the coupling.

The biasing component 1125 may bias a second input node of the sense amplifier to a precharge voltage.

The precharging component 1130 may precharge the digit line to the precharge voltage based on coupling an output node of the sense amplifier to the first input node of the sense amplifier.

The decoupling component 1135 may decouple the output node of the sense amplifier from the first input node of the sense amplifier.

The application component 1140 may apply a voltage to a capacitor while precharging the respective digit line, where the capacitor is coupled within an input node of a sense amplifier. In some examples, the application component 1140 may apply a second voltage to a second capacitor before coupling the ferroelectric memory cell with the input node of the sense amplifier, where the second capacitor is coupled within the input node of the sense amplifier, and where a second portion of the respective charge is transferred between the ferroelectric memory cell and the second capacitor based on the coupling.

The access component 1145 may perform an access operation on the first ferroelectric memory cell while the second digit line is selected.

The transmission component 1150 may transmit a first signal along the first digit line. In some examples, the transmission component 1150 may transmit a second signal along the second digit line, where the shield line includes a grounded conductive line configured to isolate the first signal from the second signal.

Figure 12:
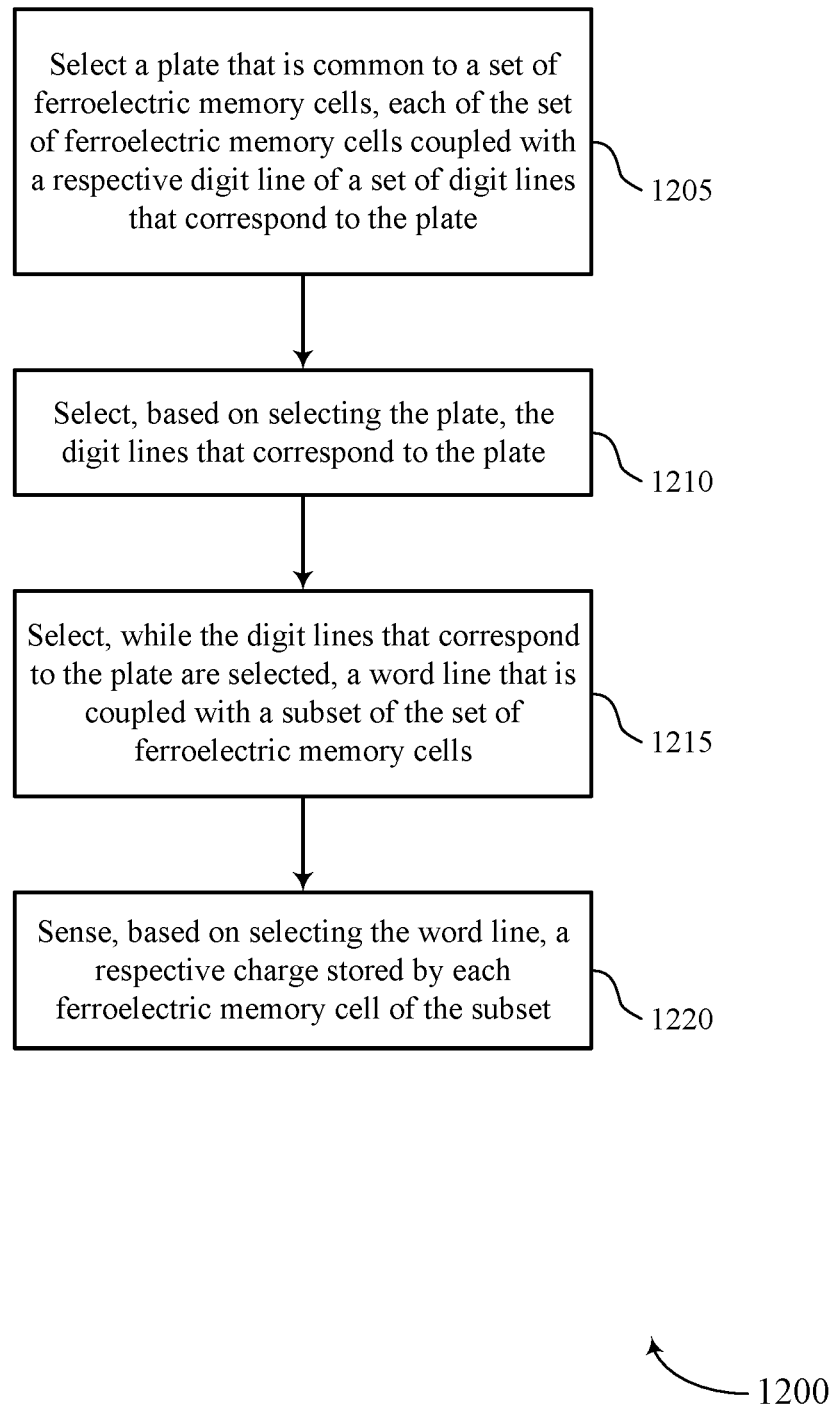
FIGS. 12 and 13 show flowcharts illustrating a method or methods that support digit line management for a memory array in accordance with examples as disclosed herein.

FIG. 12 shows a flowchart illustrating a method or methods 1200 that supports digit line management for a memory array in accordance with aspects of the present disclosure. The operations of method 1200 may be implemented by a memory array or its components as described herein. For example, the operations of method 1200 may be performed by an array management component as described with reference to FIG. 11. In some examples, a memory controller (e.g., an array management component) may execute a set of instructions to control the functional elements of the memory array to perform the described functions. Additionally or alternatively, a memory array may perform aspects of the described functions using special-purpose hardware.

At 1205, a plate that is common to a set of ferroelectric memory cells may be selected. In some examples, each of the set of ferroelectric memory cells may be coupled with a respective digit line of a set of digit lines that correspond to the plate. The operations of 1205 may be performed according to the methods described herein. In some examples, aspects of the operations of 1205 may be performed by a selecting component as described with reference to FIG. 11.

At 1210, the digit lines that correspond to the plate may be selected, based on selecting the plate. The operations of 1210 may be performed according to the methods described herein. In some examples, aspects of the operations of 1210 may be performed by a selecting component as described with reference to FIG. 11.

At 1215, a word line that is coupled with a subset of the set of ferroelectric memory cells may be selected while the digit lines that correspond to the plate are selected. The operations of 1215 may be performed according to the methods described herein. In some examples, aspects of the operations of 1215 may be performed by a selecting component as described with reference to FIG. 11.

At 1220, a respective charge stored by each ferroelectric memory cell of the subset may be sensed based on selecting the word line. The operations of 1220 may be performed according to the methods described herein. In some examples, aspects of the operations of 1220 may be performed by a sensing component as described with reference to FIG. 11.

In some examples, an apparatus as described herein may perform a method or methods, such as the method 1200. The apparatus may include features, means, or instructions (e.g., a non-transitory computer-readable medium storing instructions executable by a processor) for selecting a plate that is common to a set of ferroelectric memory cells, each of the set of ferroelectric memory cells coupled with a respective digit line of a set of digit lines that correspond to the plate, selecting, based on selecting the plate, the digit lines that correspond to the plate, selecting, while the digit lines that correspond to the plate are selected, a word line that is coupled with a subset of the set of ferroelectric memory cells, and sensing, based on selecting the word line, a respective charge stored by each ferroelectric memory cell of the subset.

In some examples of the method 1200 and the apparatus described herein, selecting the digit lines that correspond to the plate may include operations, features, means, or instructions for selecting all the digit lines that correspond to the plate simultaneously.

In some examples of the method 1200 and the apparatus described herein, selecting a digit line that corresponds to the plate may include operations, features, means, or instructions for coupling the digit line to a first input node of a sense amplifier, biasing a second input node of the sense amplifier to a precharge voltage, and precharging the digit line to the precharge voltage based on coupling an output node of the sense amplifier to the first input node of the sense amplifier.

Some examples of the method 1200 and the apparatus described herein may further include operations, features, means, or instructions for decoupling the output node of the sense amplifier from the first input node of the sense amplifier, and coupling the output node of the sense amplifier with a voltage reference. Some examples of the method 1200 and the apparatus described herein may further include operations, features, means, or instructions for coupling a second node of the capacitor with the voltage reference.

In some examples of the method 1200 and the apparatus described herein, sensing the respective charge stored by a ferroelectric memory cell of the subset may include operations, features, means, or instructions for applying a voltage to a capacitor while precharging the respective digit line, where the capacitor may be coupled within an input node of a sense amplifier, and coupling the ferroelectric memory cell with the input node of the sense amplifier based on selecting the word line after precharging the respective digit line, where a portion of the respective charge may be transferred between the ferroelectric memory cell and the capacitor based on the coupling.

In some examples of the method 1200 and the apparatus described herein, sensing the respective charge stored by the ferroelectric memory cell of the subset further may include operations, features, means, or instructions for applying a second voltage to a second capacitor before coupling the ferroelectric memory cell with the input node of the sense amplifier, where the second capacitor may be coupled within the input node of the sense amplifier, and where a second portion of the respective charge may be transferred between the ferroelectric memory cell and the second capacitor based on the coupling.

Figure 13:
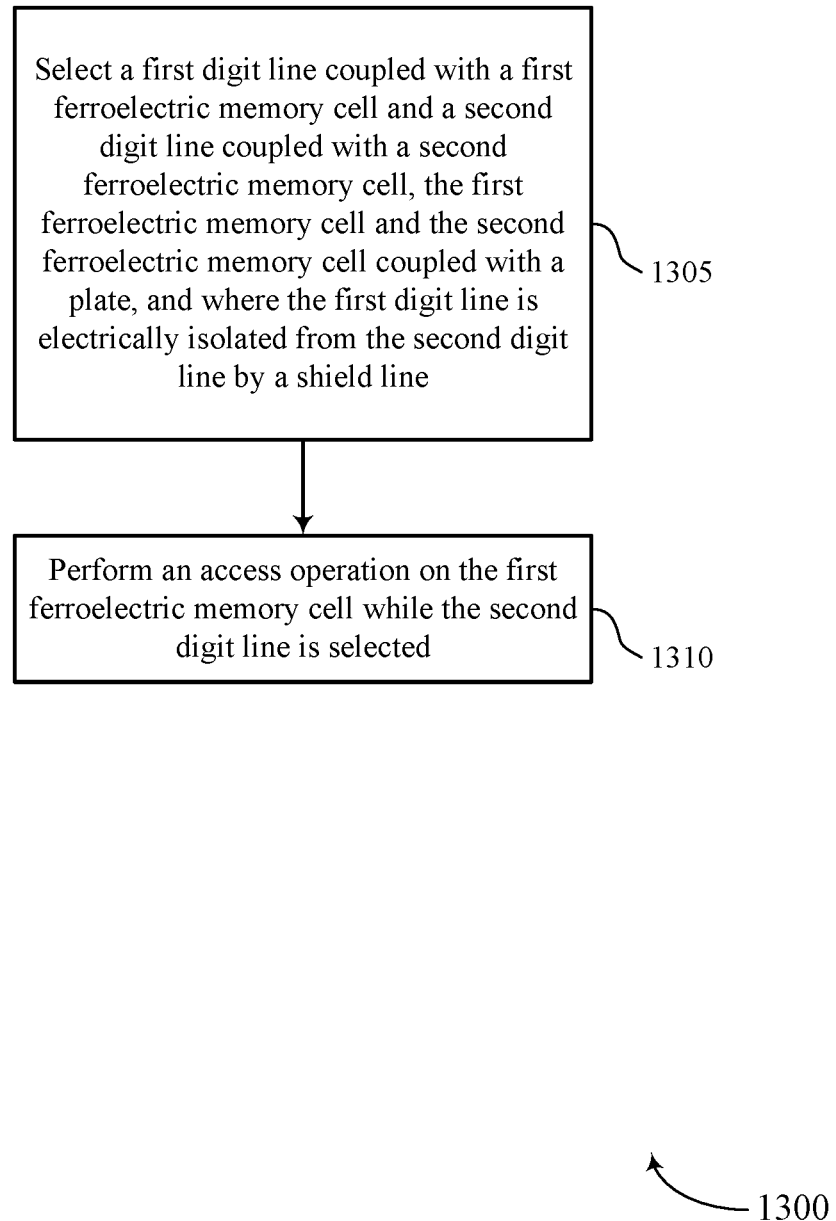

FIG. 13 shows a flowchart illustrating a method or methods 1300 that supports digit line management for a memory array in accordance with aspects of the present disclosure. The operations of method 1300 may be implemented by an array management component or its components as described herein. For example, the operations of method 1300 may be performed by a memory controller (e.g., an array management component) as described with reference to FIG. 11. In some examples, a memory array may execute a set of instructions to control the functional elements of the memory array to perform the described functions. Additionally or alternatively, a memory array may perform aspects of the described functions using special-purpose hardware.

At 1305, a first digit line coupled with a first ferroelectric memory cell and a second digit line coupled with a second ferroelectric memory cell may be selected. In some examples, the first ferroelectric memory cell and the second ferroelectric memory cell may be coupled with a plate, and the first digit line may be electrically isolated from the second digit line by a shield line. The operations of 1305 may be performed according to the methods described herein. In some examples, aspects of the operations of 1305 may be performed by a selecting component as described with reference to FIG. 11.

At 1310, an access operation may be performed on the first ferroelectric memory cell while the second digit line is selected. The operations of 1310 may be performed according to the methods described herein. In some examples, aspects of the operations of 1310 may be performed by an access component as described with reference to FIG. 11.

In some examples, an apparatus as described herein may perform a method or methods, such as the method 1300. The apparatus may include features, means, or instructions (e.g., a non-transitory computer-readable medium storing instructions executable by a processor) for selecting a first digit line coupled with a first ferroelectric memory cell and a second digit line coupled with a second ferroelectric memory cell, the first ferroelectric memory cell and the second ferroelectric memory cell coupled with a plate, and where the first digit line is electrically isolated from the second digit line by a shield line and performing an access operation on the first ferroelectric memory cell while the second digit line is selected.

Some examples of the method 1300 and the apparatus described herein may further include operations, features, means, or instructions for selecting the first digit line and the second digit line simultaneously, where performing the access operation may be based on selecting the first digit line and the second digit line simultaneously. Some examples of the method 1300 and the apparatus described herein may further include operations, features, means, or instructions for selecting a digit line of each of the set of ferroelectric memory cells during the access operation. In some examples of the method 1300 and the apparatus described herein, performing the access operation on the first ferroelectric memory cell may include operations, features, means, or instructions for transmitting a first signal along the first digit line, and transmitting a second signal along the second digit line, where the shield line includes a grounded conductive line configured to isolate the first signal from the second signal.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of sense amplifiers and a memory array including a set of plates that are each common to a respective set of ferroelectric memory cells, where each respective set of ferroelectric memory cells is coupled with a respective digit line of a set of digit lines that correspond to a plate of the set of plates and the set of digit lines that correspond to the plate of the set are configured to be concurrently coupled with a respective sense amplifier of the set.

Some examples of the apparatus may include the set of plates may include operations, features, means, or instructions for a plate selection component configured to select a selected plate within each plate group of the set, and a set of multiplexing components, where for the selected plate within each plate group of the set, each multiplexing component of the set may be configured to concurrently couple all the set of digit lines that correspond to the selected plate with the respective set of sense amplifiers for the plate group that includes the selected plate. In some examples, the respective set of sense amplifiers for the plate group may be configured to concurrently sense, for each of the set of digit lines that correspond to the selected plate, a respective amount of charge stored by a corresponding ferroelectric memory cell.

In some examples, a sense amplifier of the set of sense amplifiers may include operations, features, means, or instructions for a differential amplifier having a first input node, a second input node, and an output node, where, the first input node of the differential amplifier may be configured to be selectively coupled with a digit line of the set of digit lines that correspond to the plate, the output node of the differential amplifier may be configured to be selectively coupled with the first input node of the differential amplifier, and the differential amplifier may be configured to precharge the digit line based on a voltage at the second input node of the differential amplifier when the output node of the differential amplifier may be coupled with the first input node. In some examples, a sense amplifier of the set of sense amplifiers may include operations, features, means, or instructions for an amplifier, and a first capacitor and a second capacitor both coupled with an input node of the amplifier, where during an access operation for a ferroelectric memory cell of the respective set, the first capacitor and the second capacitor may be both configured to charge share with the ferroelectric memory cell.

In some examples, the first capacitor may be configured to be coupled with an output node of the amplifier during a first portion of the access operation. In some examples, a node of the second capacitor may be configured to be set to a first voltage during the first portion of the access operation and set to a second voltage during a second portion of the access operation. Some examples may further include all the set of digit lines that correspond to the plate may be underneath or above the plate. In some examples, each respective digit line of the set of digit lines that correspond to the plate may be located between a pair of grounded conductive lines that may be configured to electrically isolate the respective digit line from each other of the set of digit lines that correspond to the plate.

An apparatus is described. The apparatus may include a first digit line coupled with a first ferroelectric memory cell, a second digit line coupled with a second ferroelectric memory cell, a plate that is common to the first ferroelectric memory cell and the second ferroelectric memory cell, and a shield line located between the first digit line and the second digit line and configured to electrically isolate the first digit line from the second digit line during an access operation associated with the first ferroelectric memory cell, the second ferroelectric memory cell, or both.

Some examples of the apparatus may include a set of digit lines that includes the first digit line the second digit line, a set of ferroelectric memory cells that includes the first ferroelectric memory cell and the second ferroelectric memory cell, where each ferroelectric memory cell of the set may have a common plate, and where each digit line of the set may be coupled with a corresponding ferroelectric memory cell of the set, and a set of shield lines that includes the shield line, where each shield line of the set may be located between a corresponding pair of digit lines of the set and configured to electrically isolate a first digit line of the pair from a second digit line of the pair during the access operation.

In some examples, each digit line of the set may be configured to be concurrently selected during the access operation. In some examples, each digit line of the set may be configured to transmit data to or from the corresponding ferroelectric memory cell during the access operation. In some examples, the shield line includes a grounded conductive line that may be electrically isolated from each ferroelectric memory cell of the apparatus.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow. The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   selecting a plate that is common to a set of memory cells, each memory cell of the set of memory cells coupled with a respective digit line of a plurality of digit lines that correspond to the plate;
   selecting two or more consecutive digit lines of the plurality of digit lines during a same duration based at least in part on selecting the plate, wherein the two or more consecutive digit lines are directly adjacent to one another; and
   sensing a respective charge stored by each memory cell of a subset of the set of memory cells based at least in part on selecting the two or more consecutive digit lines of the plurality of digit lines.

2. The method of claim 1, wherein selecting the two or more consecutive digit lines comprises:
   selecting the two or more digit lines simultaneously.

3. The method of claim 1, wherein selecting the two or more consecutive digit lines comprises:
   selecting each digit line of the plurality of digit lines that correspond to the plate during the same duration.

4. The method of claim 1, wherein selecting the two or more consecutive digit lines comprises:
   coupling at least one digit line of the two or more consecutive digit lines to a first input node of a sense amplifier;
   biasing a second input node of the sense amplifier to a precharge voltage; and
   precharging the at least one digit line of the two or more consecutive digit lines to the precharge voltage based at least in part on coupling an output node of the sense amplifier to the first input node of the sense amplifier.

5. The method of claim 4, further comprising:
   decoupling the output node of the sense amplifier from the first input node of the sense amplifier based at least in part on precharging the at least one digit line of the two or more consecutive digit lines; and
   coupling the output node of the sense amplifier with a reference voltage based at least in part on decoupling the output node of the sense amplifier from the first input node of the sense amplifier.

6. The method of claim 5, wherein the first input node of the sense amplifier is coupled with a first node of a capacitor, the method further comprising:
   coupling a second node of the capacitor with the reference voltage based at least in part on coupling the output node of the sense amplifier with the reference voltage.

7. The method of claim 1, wherein sensing the respective charge stored by each memory cell of the subset of the set of memory cells comprises:
   applying a voltage to a capacitor while precharging the respective digit line, wherein the capacitor is coupled within an input node of a sense amplifier; and
   coupling a memory cell with the input node of the sense amplifier based at least in part on precharging the respective digit line, wherein a portion of the respective charge is transferred between the memory cell and the capacitor based at least in part on coupling the memory cell with the input node of the sense amplifier.

8. The method of claim 7, wherein sensing the respective charge stored by each memory cell of the subset further comprises:
   applying a second voltage to a second capacitor, wherein coupling the memory cell with the input node of the sense amplifier is based at least in part on applying the second voltage to the second capacitor, and wherein a second portion of the respective charge is transferred between the memory cell and the second capacitor based at least in part on coupling the memory cell with the input node of the sense amplifier.

9. An apparatus, comprising:
   a memory array comprising a plurality of plate groups that are each common to a respective set of memory cells, wherein:
   each respective set of memory cells is coupled with a respective digit line of a plurality of digit lines that correspond to a plate of a plate group of the plurality of plate groups; and
   two or more consecutive digit lines of the plurality of digit lines that correspond to the plate of the plate group are configured to be selected during a same duration, wherein the two or more consecutive digit lines are directly adjacent to one another.

10. The apparatus of claim 9, further comprising:
    a plurality of sets of sense amplifiers that are each associated with a respective plate group of the plurality of plate groups, wherein two or more sense amplifiers of a set of sense amplifiers are configured to be coupled with two or more respective digit lines of the plurality of digit lines during the same duration.

11. The apparatus of claim 10, further comprising:
    a plate selection component configured to select a plate associated with each plate group of the plurality of plate groups; and
    a plurality of multiplexing components associated with each plate group, wherein each multiplexing component of the plurality of multiplexing components is configured to concurrently couple digit lines associated with a respective plate with a respective set of sense amplifiers.

12. The apparatus of claim 11, wherein the respective set of sense amplifiers is configured to sense a respective amount of charge stored by each memory cell associated with the respective set of sense amplifiers.

13. The apparatus of claim 10, wherein a sense amplifier of the set of sense amplifiers comprises:
a differential amplifier having a first input node, a second input node, and an output node, wherein:
the first input node of the differential amplifier is configured to be selectively coupled with a digit line of the plurality of digit lines that correspond to the plate;
the output node of the differential amplifier is configured to be selectively coupled with the first input node of the differential amplifier; and
the differential amplifier is configured to precharge the digit line based at least in part on a voltage at the second input node of the differential amplifier when the output node of the differential amplifier is coupled with the first input node.

14. The apparatus of claim 10, wherein a sense amplifier of the set of sense amplifiers comprises:
a first capacitor and a second capacitor that are coupled with an input node of the sense amplifier wherein the first capacitor and the second capacitor are configured to charge share with a memory cell during a respective access operation.

15. The apparatus of claim 14, wherein the first capacitor is configured to be coupled with an output node of the sense amplifier during a first portion of the respective access operation.

16. The apparatus of claim 15, wherein a node of the second capacitor is configured to be set to a first voltage during the first portion of the respective access operation and set to a second voltage during a second portion of the respective access operation.

17. An apparatus, comprising:
a set of memory cells;
a plate that is common to the set of memory cells;
a plurality of digit lines that correspond to the plate and are coupled with respective memory cells of the set of memory cells; and
a controller coupled with one or more of the set of memory cells, the plate, and the plurality of digit lines, wherein the controller is configured to cause the apparatus to:
select the plate that is common to the set of memory cells;
select two or more consecutive digit lines of the plurality of digit lines during a same duration based at least in part on selecting the plate, wherein the two or more consecutive digit lines are directly adjacent to one another; and
sense a respective charge stored by each memory cell of a subset of the set of memory cells based at least in part on selecting the two or more consecutive digit lines of the plurality of digit lines.

18. The apparatus of claim 17, wherein, to select the two or more consecutive digit lines of the plurality of digit lines, the controller is operable to cause the apparatus to:
select the two or more consecutive digit lines simultaneously.

19. The apparatus of claim 17, wherein, to select the two or more consecutive digit lines of the plurality of digit lines, the controller is operable to cause the apparatus to:
select each digit line of the plurality of digit lines that correspond to the plate during the same duration.

20. The apparatus of claim 17, further comprising:
a sense amplifier comprising a first node, wherein the sense amplifier is coupled with the plurality of digit lines and comprises a first input node and a second input node, wherein, to select the two or more consecutive digit lines of the plurality of digit lines, the controller is operable to cause the apparatus to:
couple at least one digit line of the two or more consecutive digit lines to the first input node of the sense amplifier;
bias the second input node of the sense amplifier to a precharge voltage; and
precharge the at least one digit line of the two or more consecutive digit lines to the precharge voltage based at least in part on coupling an output node of the sense amplifier to the first input node of the sense amplifier.

* * * * *